United States Patent [19]
Williams

[11] Patent Number: 5,998,837
[45] Date of Patent: *Dec. 7, 1999

[54] TRENCH-GATED POWER MOSFET WITH PROTECTIVE DIODE HAVING ADJUSTABLE BREAKDOWN VOLTAGE

[75] Inventor: Richard K. Williams, Cupertino, Calif.

[73] Assignee: Siliconix Incorporated, Santa Clara, Calif.

[ * ] Notice: This patent is subject to a terminal disclaimer.

[21] Appl. No.: 08/919,523

[22] Filed: Aug. 28, 1997

Related U.S. Application Data

[63] Continuation-in-part of application No. 08/846,688, Apr. 30, 1997, abandoned, which is a continuation of application No. 08/459,555, Jun. 2, 1995, abandoned.

[51] Int. Cl.⁶ ............................ H01L 29/78; H01L 29/49; H01L 29/866
[52] U.S. Cl. ......................... 257/341; 257/331; 257/342; 257/328; 257/409
[58] Field of Search .................................. 257/331, 341, 257/342, 409, 328

[56] References Cited

U.S. PATENT DOCUMENTS

| | | | |
|---|---|---|---|
| 3,906,540 | 9/1975 | Hollins | 357/15 |
| 4,823,172 | 4/1989 | Mihara | 357/15 |
| 4,827,321 | 5/1989 | Baliga | 357/37 |
| 4,928,155 | 5/1990 | Nakagawa et al. | 357/23.4 |
| 4,967,243 | 10/1990 | Baliga et al. | 357/23.4 |
| 5,021,840 | 6/1991 | Morris | 357/15 |
| 5,072,266 | 12/1991 | Bulucea et al. | 357/23.4 |
| 5,111,253 | 5/1992 | Korman et al. | 357/15 |
| 5,168,331 | 12/1992 | Yilmaz | 257/331 |
| 5,191,395 | 3/1993 | Nishimura | 257/328 |
| 5,621,234 | 4/1997 | Kato | 257/339 |
| 5,689,128 | 11/1997 | Hshieh | 257/331 |
| 5,696,396 | 12/1997 | Tokura et al. | 257/341 |
| 5,814,858 | 9/1998 | Williams | 257/341 |

FOREIGN PATENT DOCUMENTS

| | | | |
|---|---|---|---|
| 0 133 642 | 3/1985 | European Pat. Off. | H01L 27/06 |
| 0 133 642 A1 | 3/1985 | European Pat. Off. | H01L 27/06 |
| 0 438 700 A1 | 7/1991 | European Pat. Off. | H01L 29/74 |
| 0 583 022 A3 | 2/1994 | European Pat. Off. | H01L 21/336 |
| 0 583 028 A1 | 2/1994 | European Pat. Off. | H01L 29/784 |
| 4 208 695 A1 | 9/1992 | Germany | H01L 29/784 |
| 42 08 695 A1 | 9/1992 | Germany | H01N 29/784 |
| 62-298152 | 12/1987 | Japan | H01L 27/08 |
| 2 269 050 | 1/1994 | United Kingdom | H01L 29/06 |

OTHER PUBLICATIONS

Masakatsu Hoshi, et al., "A DMOSFET Having A Cell Array Field Ring for Improving Avalanche Capability", May 18, 1993, IEEE Proceedings of the 5th International Symposium on Power Semiconductor Devices and IC's (ISPSD), Monterey, May 18–20, 1993, pp. 140–145, XP000380145.

Primary Examiner—Jerome Jackson, Jr.
Attorney, Agent, or Firm—Skjerven, Morrill MacPherson, Franklin & Friel LLP; David E. Steuber

[57] ABSTRACT

A power MOSFET includes a trenched gate which defines a plurality of MOSFET cells. A protective diffusion is created, preferably in an inactive cell, so as to form a PN junction diode that is connected in parallel with the channel region in each of the MOSFET cells. The diode can be designed to have a breakdown voltage which limits the strength of the electric field across the gate oxide layer. Several techniques can be used to adjust the breakdown voltage of the PN diode and to insure that breakdown occurs away from the sidewall of the trench, where it could cause impact ionization which could damage the gate oxide layer. According to one technique, a region of the epitaxial layer beneath the PN junction can be doped more heavily than the background level in the epitaxial layer to reduce the breakdown voltage of the PN junction diode. Also the radius of curvature of the PN junction and the separation between the protective diffusion and the heavily doped substrate can be used for this purpose. In other embodiments a zener diode is formed in the diode cell, located either at the surface of the epitaxial layer or buried in the diode cell.

14 Claims, 23 Drawing Sheets

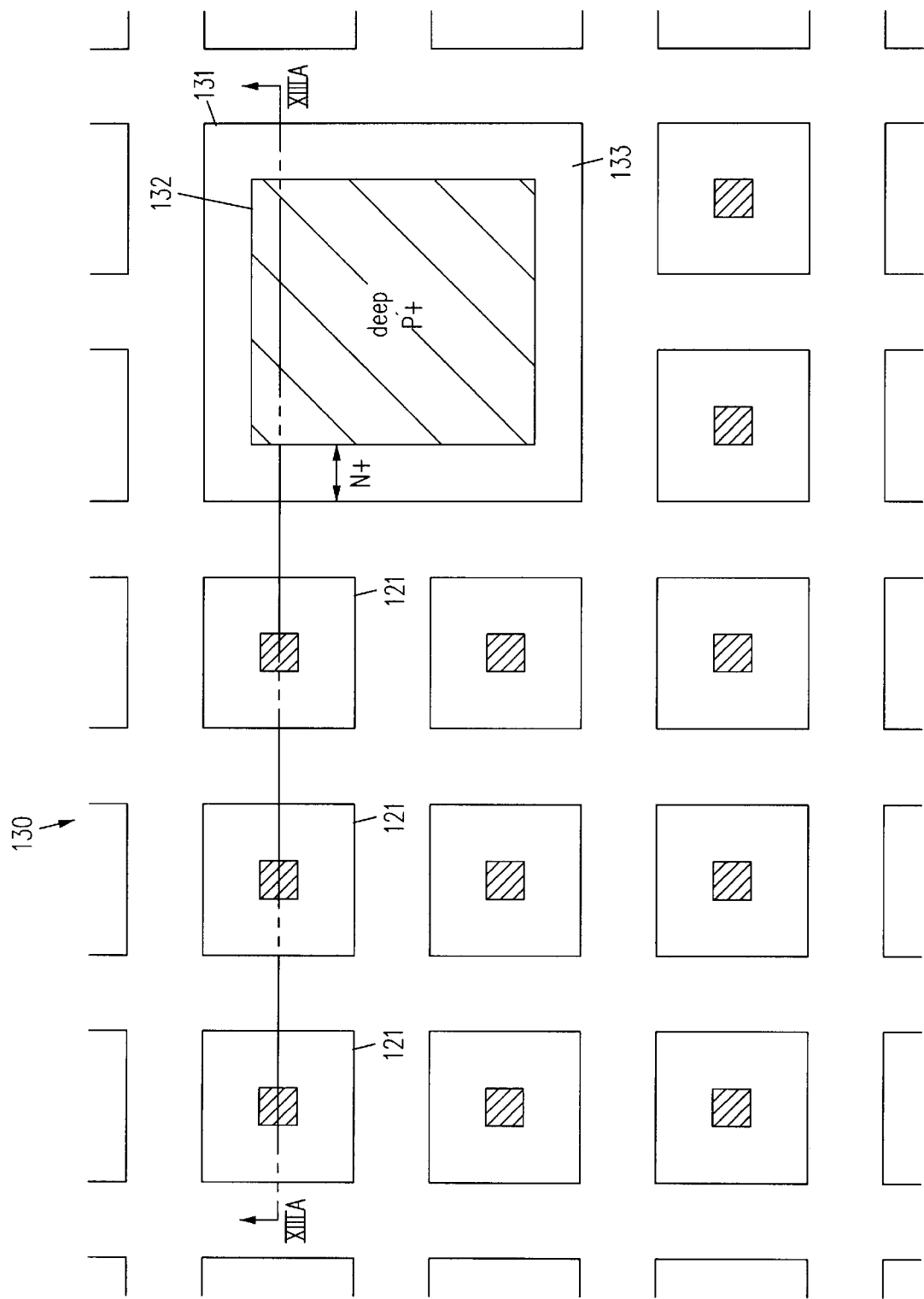

TRENCH-GATED POWER MOSFET WITH PROTECTIVE DIODE HAVING ADJUSTABLE BREAKDOWN VOLTAGE

CROSS REFERENCE TO RELATED APPLICATIONS

This application is a continuation-in-part of application Ser. No. 08/846,688, filed Apr. 30, 1997, now abandoned which is a continuation of application Ser. No. 08/459,555, filed Jun. 2, 1995 abandoned, which is related to application Ser. No. 08/460,336, filed Jun. 2, 1995 abandoned, each of which is incorporated herein by reference in its entirety.

FIELD OF THE INVENTION

This invention relates to power field-effect transistors and, in particular, to a metal-oxide-silicon field-effect transistor (MOSFET) in which the gate is positioned in a trench formed on the surface of the silicon.

BACKGROUND OF THE INVENTION

Trench-gated MOSFETs are a class of MOSFETs in which the gate is positioned in a trench that is formed at the surface and extends into the silicon. The gate is formed in lattice-like geometric pattern which defines individual cells of the MOSFET, the pattern normally taking the form of closed polygons (squares, hexagons, etc.) or a series of interdigitated stripes or rectangles. The current flows in vertical channels which are formed adjacent to the sides of the trenches. The trenches are filled with a conductive gate material, typically doped polysilicon, which is insulated from the silicon by a dielectric layer normally consisting of silicon dioxide.

Two critical characteristics of a power MOSFET are its breakdown voltage, i.e., the voltage at which it begins to conduct current when in an off condition, and its on-resistance, i.e., its resistance to current flow when in an on condition. The on-resistance of a MOSFET generally varies directly with its cell density, since when there are more cells per unit area there is also a greater total "gate width" (around the perimeter of each cell) for the current to pass through. The breakdown voltage of a MOSFET depends primarily on the doping concentrations and locations of the source, body and drain regions in each MOSFET cell.

The MOSFET is typically formed in a lightly-doped epitaxial layer of silicon which is grown on a heavily-doped silicon substrate. The gate trenches normally extend into the epitaxial layer and are frequently rectangular, with flat bottoms bounded by corners. This configuration creates a problem in that, when the MOSFET is turned off, the electric field reaches a maximum near the corners of the gate trenches. This can lead to avalanche breakdown and impact ionization near the surface of the gate oxide, with the consequent generation of carriers. If the carriers are generated within a mean free path of the interface between the silicon and the gate oxide, they may have sufficient energy to pass through the interface and become injected into the gate oxide layer. Carriers that are able to surmount the silicon/silicon dioxide energy barrier are often referred to as "hot carriers." Hot carrier injection can ultimately damage the gate oxide layer, causing changes in threshold voltage, transconductance or on-resistance, and thereby impair or destroy the MOSFET.

U.S. Pat. No. 5,072,266 teaches a technique of suppressing voltage breakdown near the gate by the formation, in the MOSFET cell, of a deep central body diffusion that extends below the bottom of the trenches. This deep central diffusion shapes the electric field in such a way that breakdown occurs in the bulk silicon away from the gate, in a location which prevents hot carriers from reaching the gate oxide layer. A cross-sectional view of a MOSFET in accordance with U.S. Pat. No. 5,072,266 is shown in FIG. 1, which illustrates a MOSFET cell 10 containing a trenched gate 11, an N+ source region 12, an N+ substrate (drain) 13, an N-epitaxial layer 14, and a deep central P+ diffusion 15. Note that the lowest point of P+ diffusion 15 is below the bottom of gate 11.

The doping of deep P+ diffusion 15 is greater than the doping of P-body 16 in the region of the channel, designated by the dashed line and reference numeral 17. As a result, the distance $Y_S$ between the gate trenches must be maintained at or above a minimum value. Otherwise, the deep P+ dopant will diffuse into the channel 17 and raise the threshold voltage $V_{th}$ of the device. The value of $Y_S$, along with the thickness of the gate, defines the cell density and helps to determine the on-resistance of the MOSFET.

To fabricate an extremely low voltage, low on-resistance power MOSFET, the dimensions of the device are generally scaled down. In particular, the cell density is increased and the epitaxial layer is made thinner, even to the point that the gate trenches may extend into the heavily-doped substrate. Such a MOSFET is illustrated as MOSFET 20 in FIG. 2A.

This creates an entirely new set of design criteria. Referring to FIG. 2A, since the corners 21C of the gate trenches 21 are surrounded by the N+ substrate 13, the electric field at these locations drops entirely across the gate oxide layer. While the formation of hot carriers in the silicon may be lower, the high electric field on the gate oxide layer may still lead to device degradation or damage. In one condition, when the gate is biased at essentially the same potential as the source and body (i.e., the device is turned off), a serious concern is that the gate oxide layer at the bottom of the trenches must support the entire voltage across the device. Compared to the embodiment of FIG. 1, there is no epitaxial layer to absorb a portion of this voltage difference.

An equivalent circuit for MOSFET 20 is shown in FIG. 2B. Diode $D_{DB}$ represents the PN junction between N-epitaxial layer 14 and P-body region 22, and capacitor $C_{GD}$ represents the capacitor across the gate oxide layer 21A

SUMMARY OF THE INVENTION

The trench-gated MOSFET of this invention is formed in a semiconductor chip which includes a substrate alone or in combination with an overlying epitaxial layer. The gate of the MOSFET is formed in a trench which extends downward from the surface of the chip. The MOSFET includes a source region of a first conductivity type, a body region of a second conductivity type, and a drain region of the first conductivity type, which are arranged vertically along a side wall of the trench. The gate trenches may extend into the epitaxial layer, or through the epitaxial layer into the substrate.

The MOSFET is formed as a plurality of cells which are defined by the gate trench. The cells may be of any shape. For example, the cells may be in the form of a square or hexagon or a series of parallel stripes or rectangles.

In accordance with this invention, there is created in the chip a protective diffusion of the second conductivity type, which forms a PN junction with first conductivity material in the epitaxial layer or substrate. This PN junction functions as a diode. A metal layer ties the protective diffusion (i.e., one terminal of the diode) to the source regions of the MOSFET cells such that the diode is connected in parallel with the channels of the MOSFET cells.

In a preferred embodiment, the protective diffusion is formed in certain of the cells in a selected pattern across the MOSFET.

The protective diffusion of second conductivity type operates to reduce the strength of the electric field across the gate oxide and at the corners of the trenches and limits the formation of hot carriers in the vicinity of the trench, particularly in embodiments wherein the trenches extend into the epitaxial layer. The diode operates as a voltage clamp and thereby limits the voltage across the gate oxide layer, particularly in embodiments wherein the trenches extend into the substrate and the gate oxide must support the entire voltage drop across the MOSFET.

In a preferred embodiment, one cell containing a protective diffusion ("diode cell") is provided for a selected number of active MOSFET cells ("active cells"), in a repetitive pattern across the MOSFET. The number of diode cells per active cells is determined by the design criteria of the MOSFET. In general, for example, MOSFETs will require a greater proportion of diode cells if they are expected to experience breakdown more often, if they are driven to higher avalanche currents, or if they are required to absorb a greater amount of energy in avalanche breakdown.

The presence of the diode cell also tends to carry a large portion of the drain-to-body diode current when the MOSFET is operated with its body diode forward-conducting. Such operation (called Quadrant III operation for an N-channel device) commonly occurs when an inductor or motor is driven by a push-pull or bridge-configured pair of MOSFETs. High diode currents in the active cells are undesirable since they may lead to minority charge storage, which complicates diode turn-off (forced diode reverse recovery) and may lead to snapback of the parasitic source-body-drain active cell NPN bipolar transistor when a high reverse voltage is once again applied across the device.

The invention also comprises various techniques for controlling the breakdown voltage of the diode cell. In one embodiment, a breakdown voltage control region having a dopant concentration of the first conductivity type greater than the background dopant concentration of the epitaxial layer is formed in the diode cell. The region is preferably located at center of the diode cell and can be formed by implanting dopant through the top surface of the epitaxial layer or by updiffusing dopant from the interface between the epitaxial layer and the substrate.

Another technique for controlling the breakdown voltage of the diode cell involves providing a curved segment in the PN junction between the protective diffusion of the second conductivity type and the epitaxial layer and establishing a selected radius of curvature the curved segment so as to control the breakdown voltage of the diode cell. In general, reducing the radius of curvature of the curved segment reduces the breakdown voltage. Moreover, the distance which separates the protective diffusion from the substrate also can be used to determine the breakdown voltage of the diode cell, since the protective diffusion, the substrate and the intervening portion of the epitaxial layer form a PIN diode whose breakdown is primarily a function of the width and dopant concentration of the intervening portion of the epitaxial layer.

In additional embodiments a zener diode is formed in the diode cell, preferably by continuing into the diode cell the diffusions that are used to form the source and body in the MOSFET cell. In one group of embodiments a zener diode is formed near the surface of the epitaxial layer; in another group of embodiments a buried zener diode is formed in the diode cell.

BRIEF DESCRIPTION OF THE DRAWING

FIGS. 13A and 13B illustrate cross-sectional and top views, respectively, of a sixth embodiment, which includes a wide protective cell.

DESCRIPTION OF THE INVENTION

Figure 3:
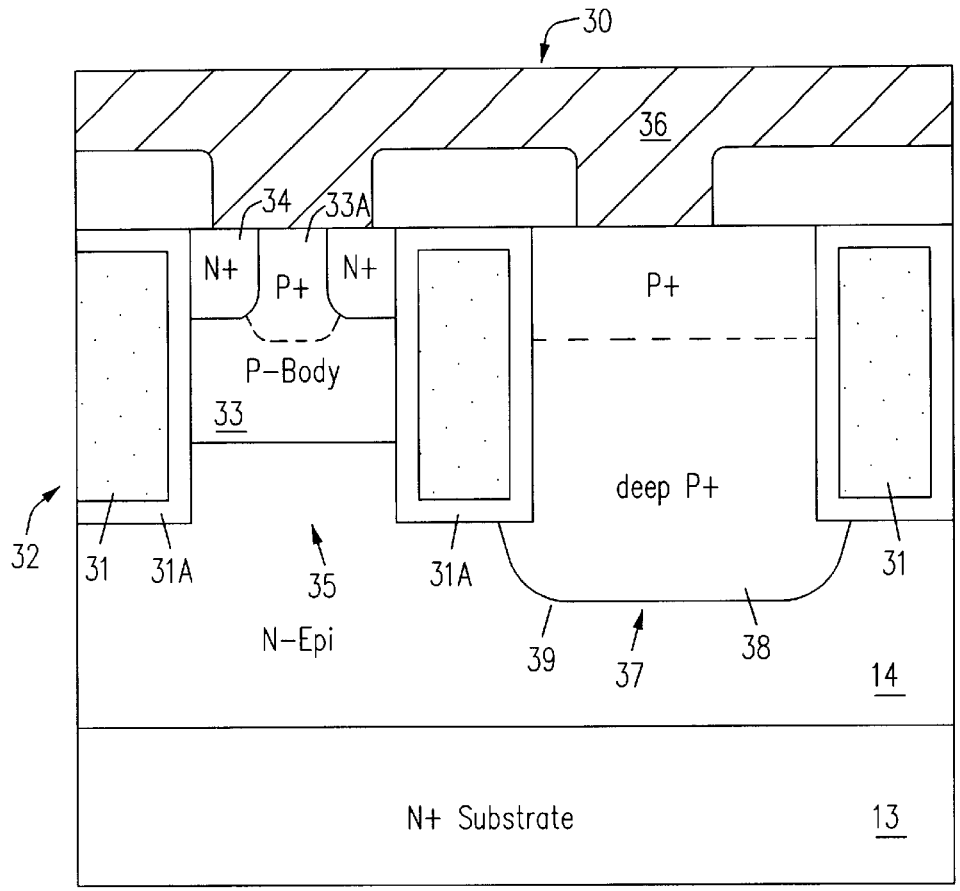
FIG. 3 illustrates a cross-sectional view of a first embodiment of this invention including a protective diffusion in an adjacent MOSFET cell.

A first embodiment of the invention is illustrated in FIG. 3. A trench-gated MOSFET 30 is formed in N-epitaxial layer 14, which is grown on the top surface of N+ substrate 13. A gate 31, formed in a trench 32, is separated from the semiconductor material by an oxide layer 31A. A cell 35 of MOSFET 30 also includes a P-body region 33, a shallow P+ contact region 33A, and an N+ source region 34. A metal layer 36 makes contact with and forms a short between P-body region 33 and N+ source region 34.

N+ substrate 13 serves as the drain of MOSFET 30 and may be contacted from the bottom. Alternatively, a submerged N+ layer instead of the N+ substrate could be used as the drain, and the drain could be contacted from the top side of the structure by means of, for example, an N+ sinker region and a top side contact.

In a neighboring cell 37 a protective deep P+ diffusion 38 is formed. Diffusion 38 forms a PN junction 39 with N-epitaxial layer 14. Metal layer 36 contacts protective diffusion 38, and thus PN junction 39 represents a diode which is connected in parallel with the channel of cell 35.

Protective diffusion 38 limits the strength of the electric field and resulting carrier formation near the corners of trench 32 and thereby eliminates the need for a deep central diffusion in MOSFET cell 35. With no deep central P+ diffusion, the dimensions of MOSFET cell 35 may be substantially reduced and the cell density of MOSFET 30 may be significantly increased. For example, the width of each side of N+ source region 34 may be reduced to about 1.0 $\mu$m, and the width of the contact between metal layer 36 and the P+ contact region for P-body 33 may be reduced to about 1.0 $\mu$m, so that the total width between trenches 32 may be on the order of 3.5 $\mu$m, although in practice the total width between trenches 32 might be set at 5.0 $\mu$m. This compares with a minimum width of about 8.0 $\mu$m for a MOSFET cell which contains a deep central diffusion (see FIG. 1).

Figure 2A:
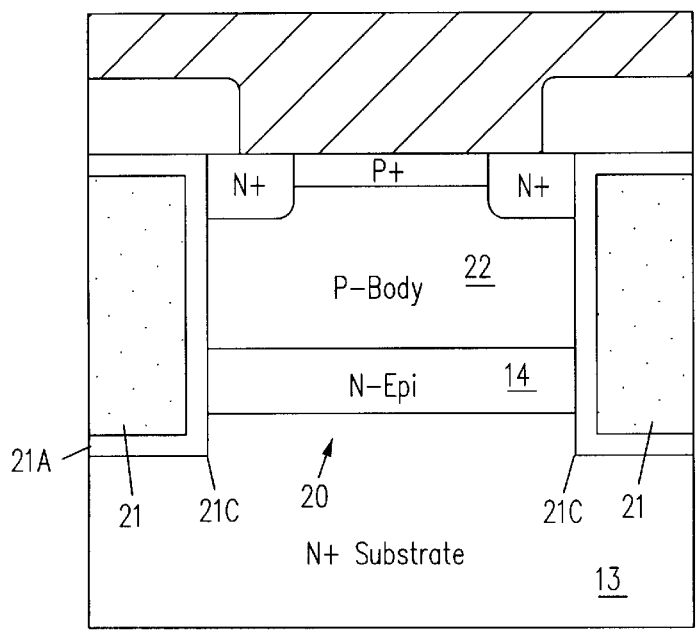
FIG. 2A illustrates a cross-sectional view of a conventional trench-gated MOSFET without a deep central diffusion and wherein the trenches extend into the substrate.
Figure 2B:
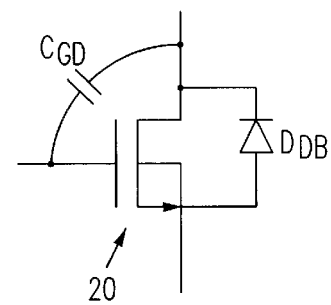
FIG. 2B illustrates an equivalent circuit diagram for the MOSFET of FIG. 2A.
Figure 4A:
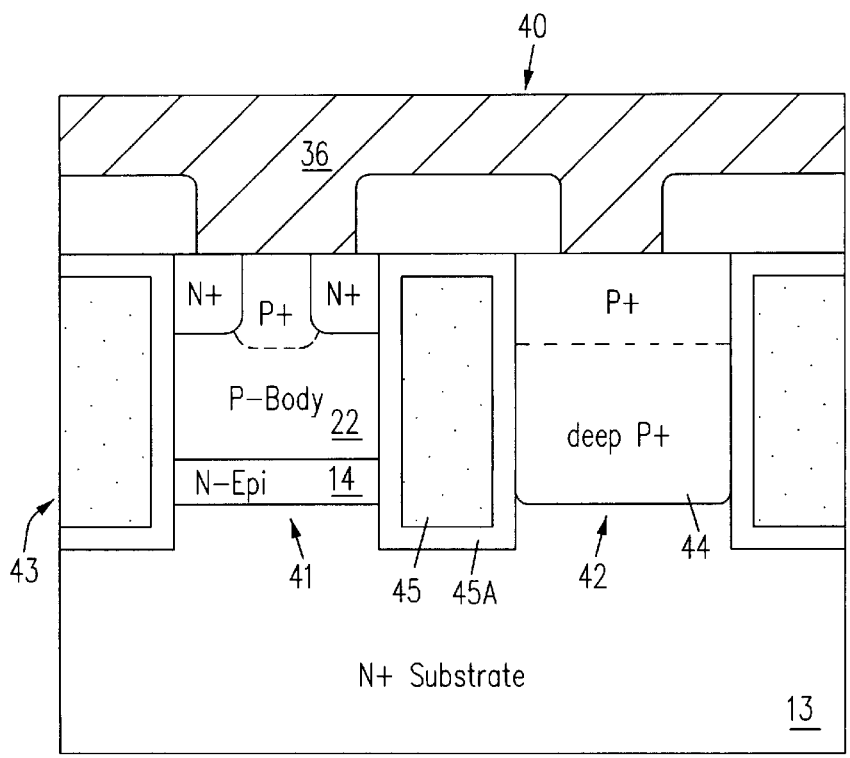
FIG. 4A illustrates a cross-sectional view of a second embodiment of this invention including a protective diffusion in an adjacent MOSFET cell and wherein the trenches extend into the substrate.

FIG. 4A illustrates a MOSFET 40 which includes a MOSFET cell 41 similar to the cell shown in FIG. 2A. That is, trenches 43 extend through the N-epitaxial layer 14 and into the N+ substrate 13, and cell 41 does not include a central deep P+ diffusion. In an alternative embodiment trenches 43 could extend into an updiffusion of the N+ substrate, i.e., a transition region between the N-epi layer and the N+ substrate having a concentration greater than the N-epi layer but less than the N+ substrate. In an adjacent cell 42, a protective P+ diffusion 44 is formed, with the lower junction of diffusion 44 reaching the top surface of N+ substrate 13.

Figure 4B:
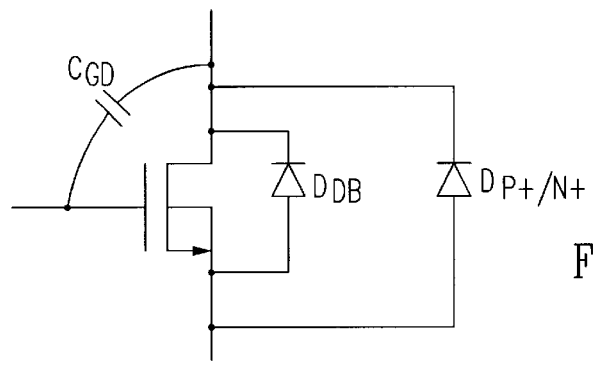
FIG. 4B illustrates an equivalent circuit diagram for the MOSFET of FIG. 4A.

FIG. 4B illustrates an equivalent circuit for MOSFET 40. Since the corners of trench 43 are located in the N+ substrate 13, which being heavily-doped cannot support a strong electric field, the problem of the electric field at the corners of the trenches is largely eliminated. Instead, the critical factor becomes the strength of the electric field between the gate 45 and the N+ substrate 13, i.e., across the gate oxide layer 45A. This location is represented by a capacitor $C_{GD}$ in FIG. 4B. The PN junction between P-body region 22 and N-epitaxial layer 14 is represented by a diode $D_{DB}$, and the PN junction between P+ diffusion 44 and N+ substrate 13 is represented by a diode $D_{P+/N+}$. As shown, both diode $D_{DB}$ and diode $D_{P+/N+}$ are connected in parallel with the channel of MOSFET cell 41.

Figure 1:
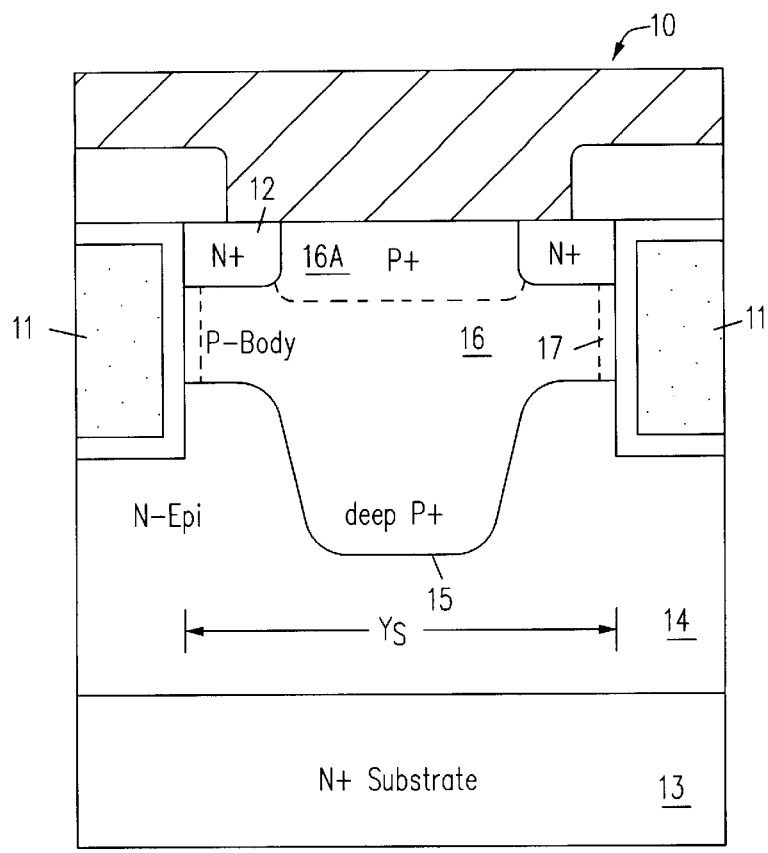
FIG. 1 illustrates a cross-sectional view of a conventional trench-gated MOSFET containing a deep central diffusion to reduce the electric field at the corners of the trenches.
Figure 5:
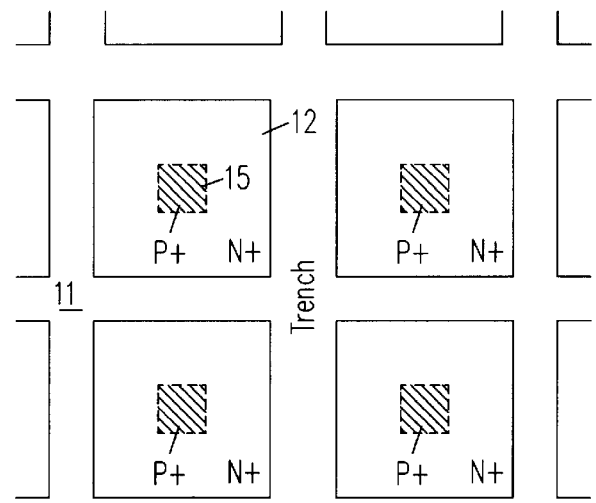
FIG. 5 illustrates a top view of a conventional MOSFET cell.

FIG. 5 shows a top view of the conventional MOSFET 10 shown in FIG. 1. The protective deep P+ region 15 is shown at the center of each square cell, surrounded by the N+ source region 12 and the gate 11. Four complete cells are shown in FIG. 5.

Figure 6:
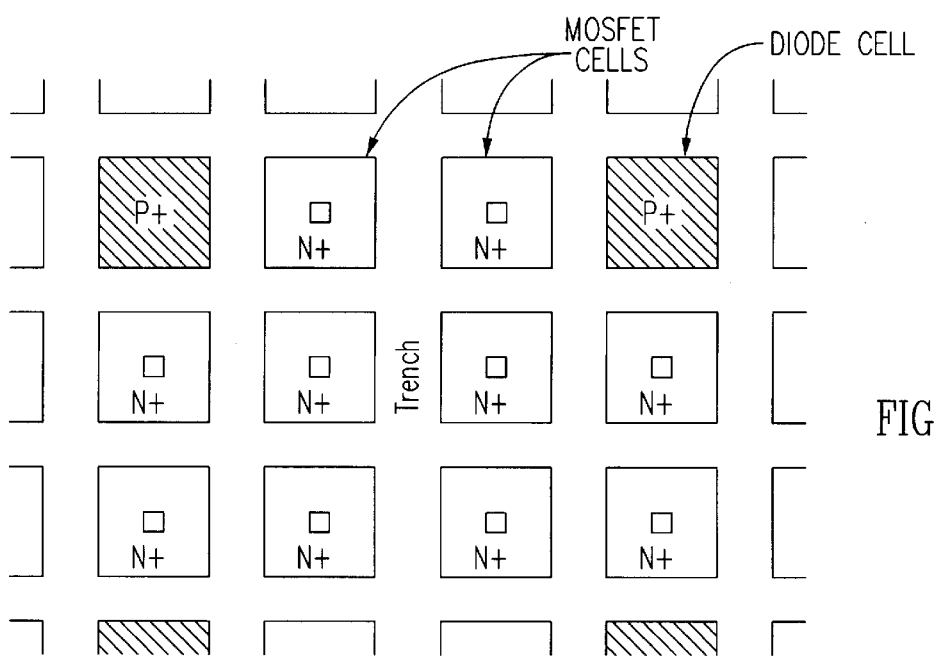
FIG. 6 illustrates a top view of a square-celled MOSFET in accordance with this invention.

FIG. 6 shows a top view of the MOSFET 30 shown in FIG. 3. A top view of MOSFET 40 shown in FIG. 4A would appear similar. Because the protective P+ region at the center of each cell has been eliminated, the dimensions of the cells have been reduced. The cells which contain the P+ diffusions (sometimes referred to as "diode cells") are also shown. In FIG. 6, there is one diode cell for every eight active MOSFET cells (total of nine cells). In the center of the MOSFET cells, the opening in the N+ ring exposes the underlying P-body diffusion. A shallow P+ implant or diffusion may be positioned in these regions to insure good electrical contact to the P -body if the surface dopant concentration of the P-body is too low.

Figure 7:
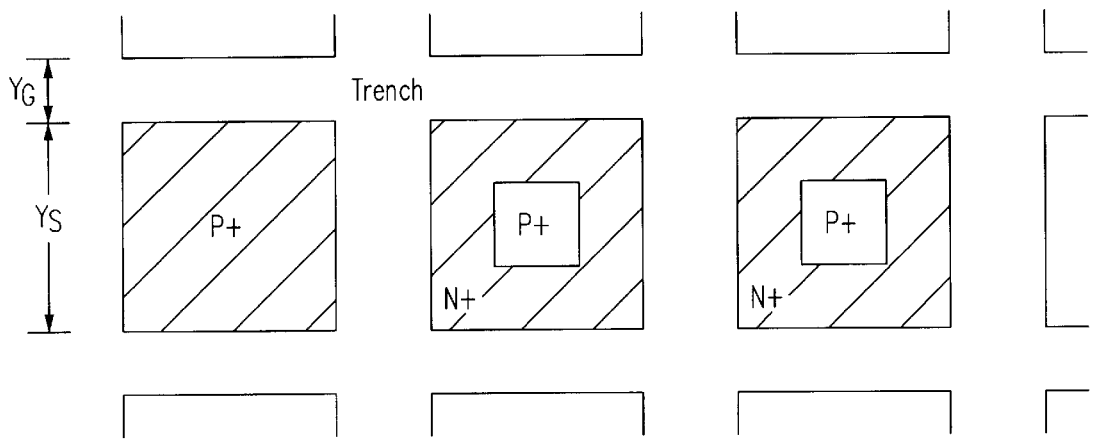
FIG. 7 illustrates a detailed top view of the square-celled MOSFET of FIG. 6.

FIG. 7 shows a detailed top view of three of the cells shown in FIG. 6 (two active MOSFET cells and one diode cell). In FIG. 7, $Y_S$ represents the distance between the trenched gates and $Y_G$ represents the cross-sectional width of the trench (not to be confused with the gate width W which is the same as the perimeter of the cell). Assuming that there is one diode cell for every n total cells, the following equation gives the total area A of the n cells:

$$A=(Y_G+Y_S)^2+(n-1)(Y_G+Y_S)^2=n(Y_G+Y_S)^2$$

Since n−1 of these cells are active MOSFET cells, the total gate width W in the n cells is equal to:

$$W=4Y_S(n-1)$$

Accordingly, the area-to-width ratio A/W (a figure of merit indicating how effectively a gate width W is packed into an area A) equals:

$$\frac{A}{W} = \frac{(Y_G + Y_S)^2}{4Y_S} \cdot \frac{n}{n-1}$$

Thus the ratio A/W for a MOSFET which contains diode cells is increased by the factor n/(n−1), as compared with a conventional MOSFET with no diode cells. This "penalty" factor, which arises from the fact that the diode cells carry no current, approaches unity as n increases. The penalty is counterbalanced by the increased total gate width (and hence current-carrying capacity) which is obtained by increasing the cell density of the device. Generally, n is determined by the frequency with which the MOSFET is expected to break down or the severity of the expected breakdown, i.e., how deeply it is driven into avalanche. Devices which are expected to break down more frequently will generally require a lower n, i.e., there must be a greater number of diode cells relative to the total number of cells. In the extreme case where every other cell is an inactive (i.e., diode) cell, N=2 and n/(n−1)=2, the efficiency benefits of this structure are somewhat limited. On the other hand, if only one of every 21 cells is a diode, for example, n=21 and n/(n−1)=21/20, representing virtually no penalty for the diodes.

In conclusion, the regularly distributed inclusion of non-active deep P+ cells in a vertical trench FET provides a voltage clamping feature which limits the carrier generation rate and electric field at the corners or in the vicinity of the trench gate. The reliability and survivability of the device in the presence of electrical overstressing is thereby improved without limiting on-resistance or cell density. The deep P+ region need not extend to the trench edge but may be made smaller than its cell geometry if desired. The deep P+ region need not extend below the trench if the trench overlaps the N+ substrate, in which case a PIN diode may be formed between the deep P+ region and the N+ substrate (see FIGS. 9–11), or if the diode voltage-clamps at a low enough voltage to protect the device. A graph showing the breakdown voltage of a PIN diode (such as diode D2 in FIG. 11) as a function of the doping concentration and width of the intermediate or "intrinsic" region is provided in S. M. Sze, *Physics of Semiconductor Devices*, Second Edition, John Wiley & Sons (1981), p. 105, FIG. 32, which is incorporated herein by reference.

Figure 8A:
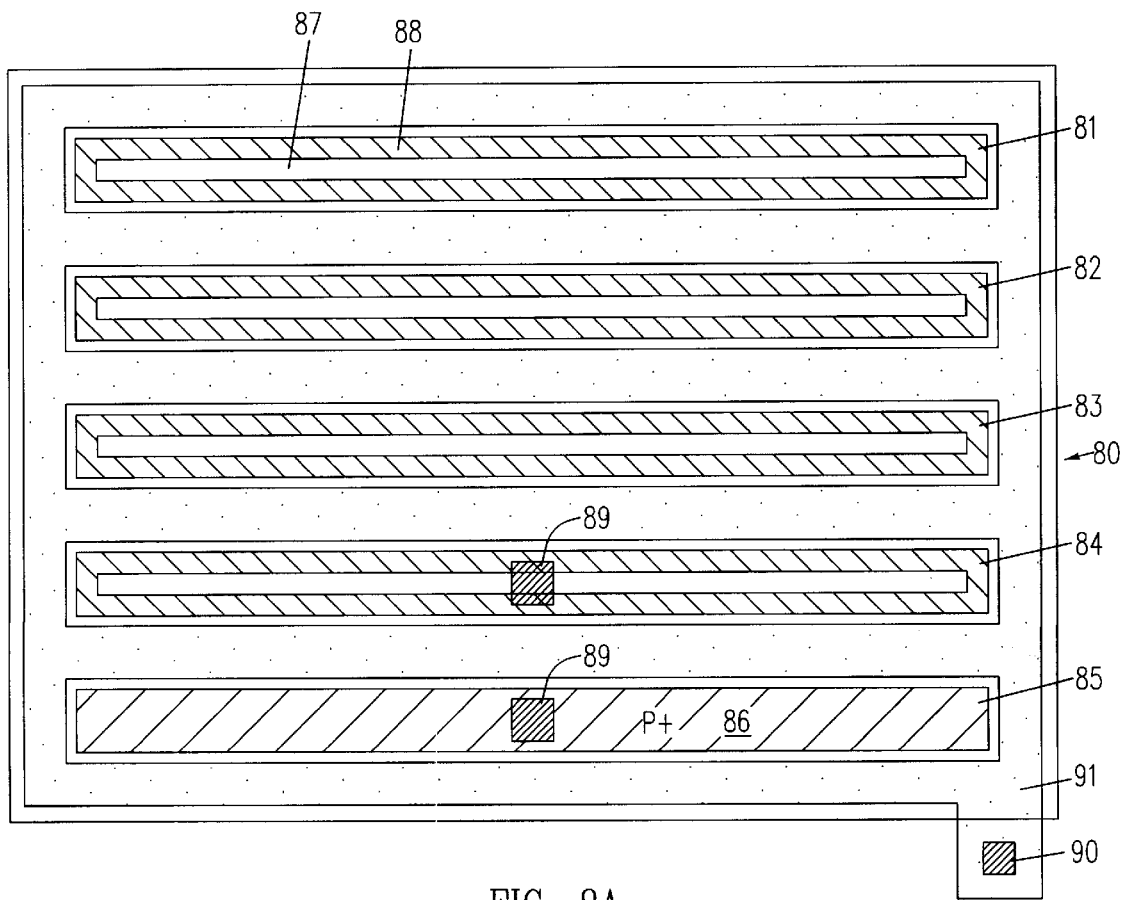
FIG. 8A illustrates a top view of a striped-cell MOSFET in accordance with this invention.

FIG. 8A illustrates a top view of an alternative MOSFET in which the cells are in the form of stripes. In MOSFET 80, cells 81, 82, 83 and 84 are active MOSFET cells, and cell 85 is a diode cell which contains a protective P+ diffusion 86. Each of cells 81–84 contains a P+ contact region 87 and an N+ source region 88. Contact holes 89, two of which are shown in FIG. 8, are used to provide contact between a metal layer (not shown) and P+ region 87 and N+ source region 88 in MOSFET cells 81–84 and P+ region 86 in diode cell 85. The opening in the N+ ring may include added dopant (as a shallow P+ diffusion) to improve contact to the underlying P-body diffusions. Contact holes 89 may be arranged in a variety of patterns over cells 81–85 but are generally repeated for maximum contact area. Alternatively, the contact may be in the form of a continuous stripe. A contact hole 90 for making contact with gate 91 is also shown.

For a stripe of length Z with a gate-to-gate (mesa) dimension in the narrow direction of $Y_S$ and a lateral gate dimension (trench width) of $Y_G$, then the area of one repetition of the device pattern is given by $$A = (Y_G + Y_S)(Z + Y_G) + (n-1)(Y_G + Y_S)(Z + Y_G) = n(Y_G + Y_S)(Z + Y_G)$$

For a stripe, however, it is assumed that $Z \gg Y_G$. Therefore $$A \approx n(Y_G + Y_S)Z$$

The perimeter of such a stripe geometry is equal to $$W = 2(Z + Y_S)(n-1)$$

But for $Z \gg Y_S$:

$$A \approx 2Z(n-1)$$

The figure of merit A/W is equal to:

$$\frac{A}{W} = \frac{(n)(Y_G + Y_S)(Z + Y_G)}{2(n-1)(Z + Y_S)}$$

which if $Z \gg Y_G$ and $Z \gg Y_S$ yields $$\frac{A}{W} = \frac{(Y_G + Y_S)}{2Y_S} \cdot \left(\frac{n}{n-1}\right)$$

which has the same penalty factor n/(n−1) as described above and is independent of Z.

Checking the exact solution above in the case of a square cell (i.e., $z = Y_S$) gives the following:

$$\frac{A}{W} = \frac{(Y_G + Y_S)^2}{4Y_S} \cdot \left(\frac{n}{n-1}\right)$$

which is the same as the result derived above for the square cell design.

Figure 8B:
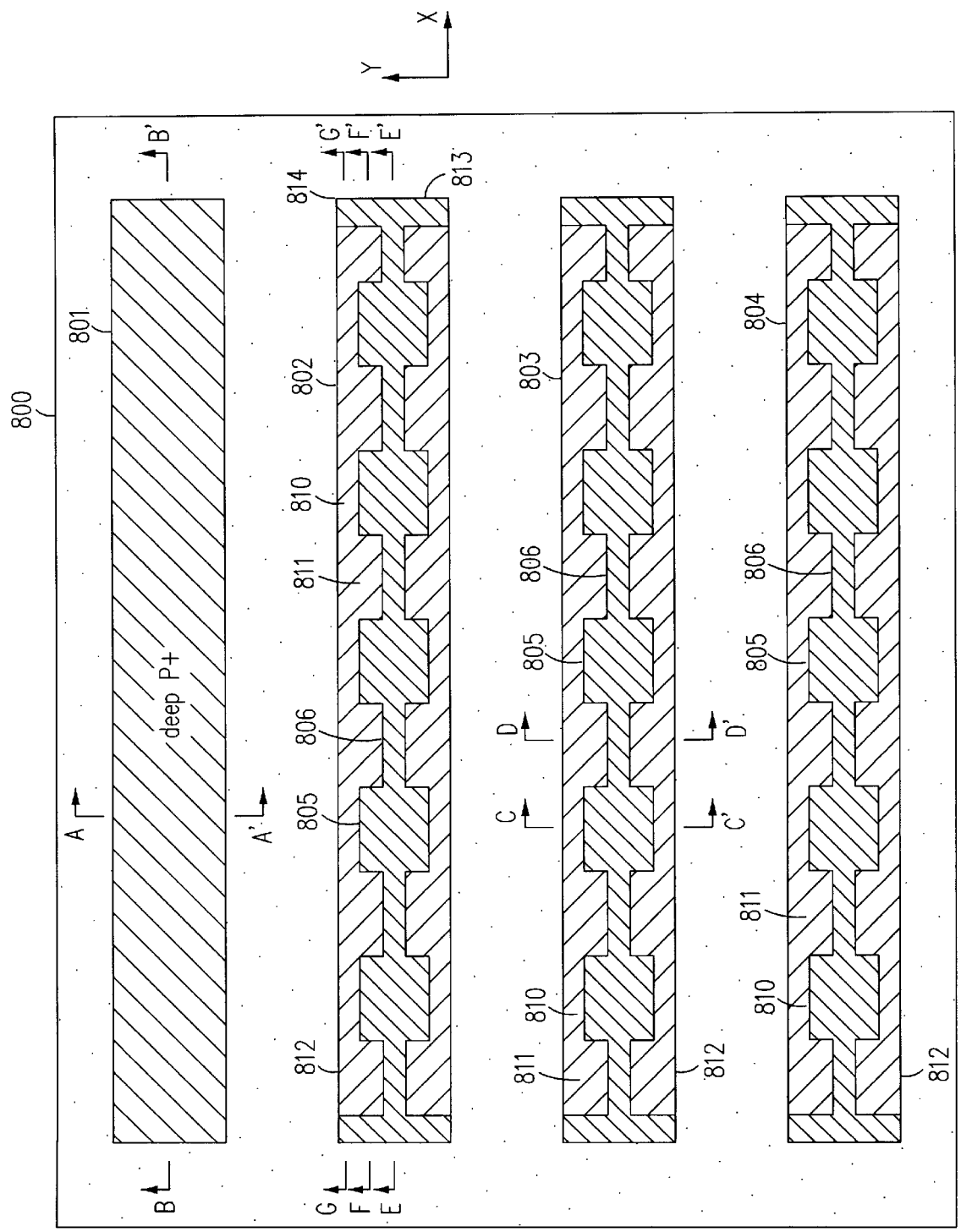
FIG. 8B illustrates a plan view of another form of striped-cell MOSFET containing a series of wide body contact regions which uses the principles of this invention.

FIG. 8B illustrates a plan view of an alternative stripe design in a MOSFET 800. Protective P+ diffusion 801 is generally similar to diffusion 86 in FIG. 8A. Views of protective P+ diffusion 801 at cross-sections AA' and BB' are shown in FIGS. 8C and 8D.

Figure 8F:
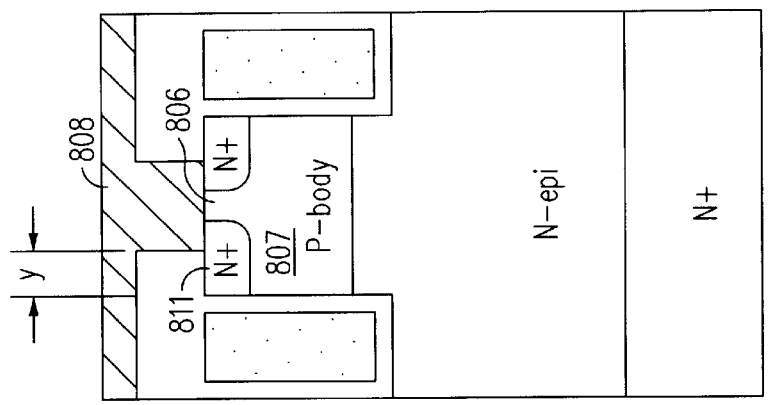
FIGS. 8C–8I show views of the striped cell MOSFET of FIG. 8B taken at various cross-sections.
Figure 8E:
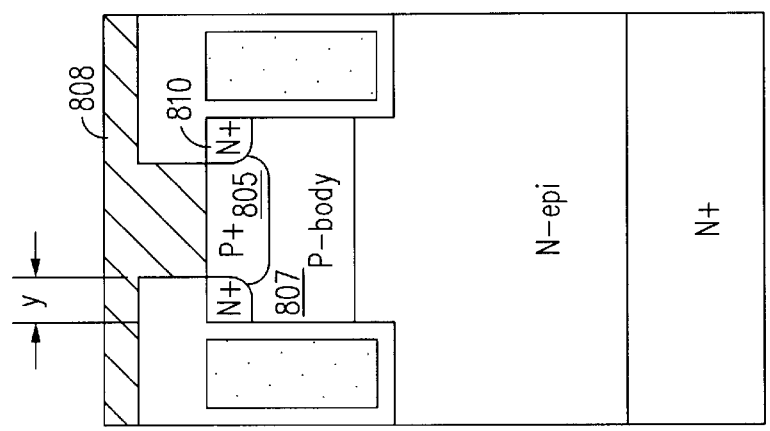
Figure 8C:
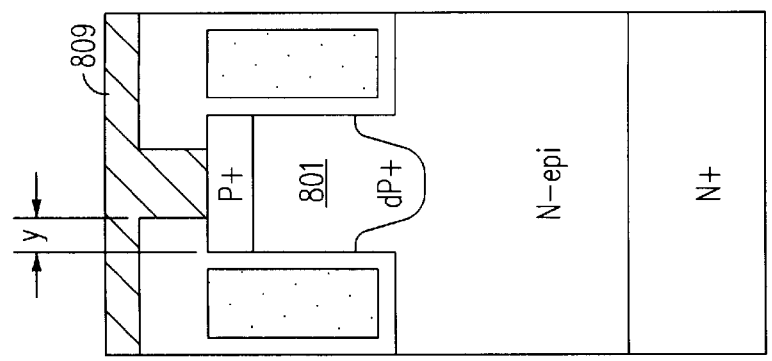
Figure 8D:
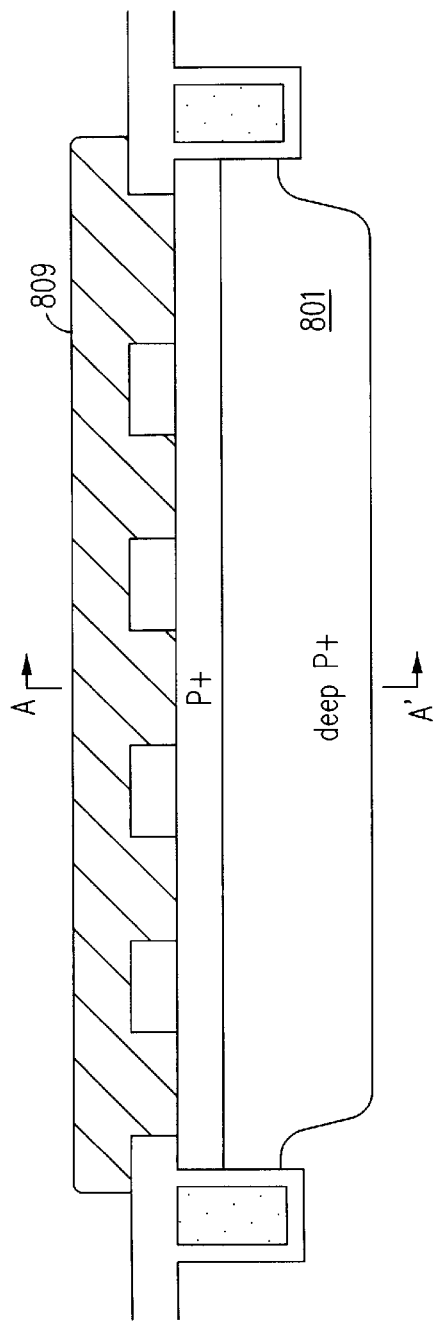
Figure 8G:
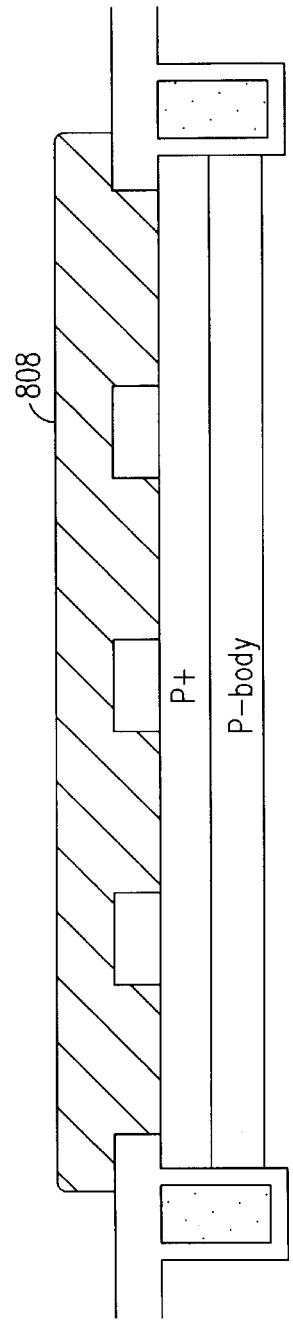
Figure 8H:
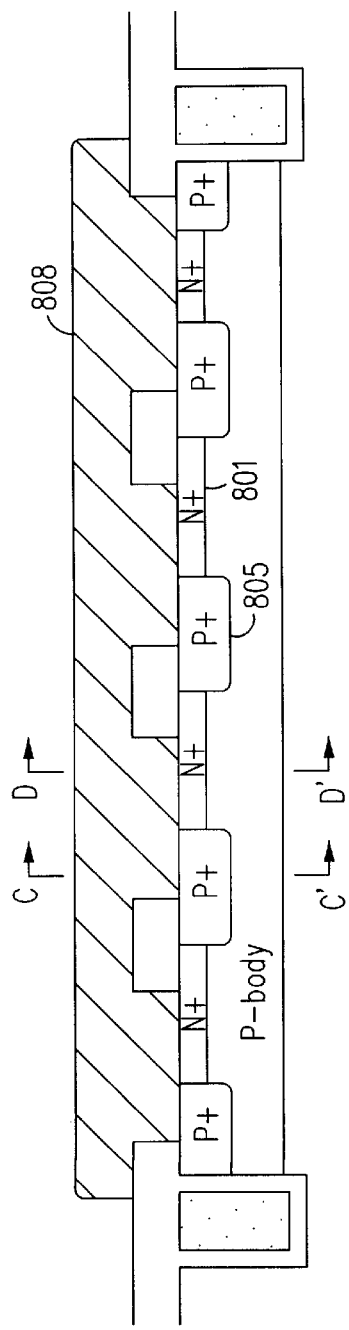
Figure 8I:
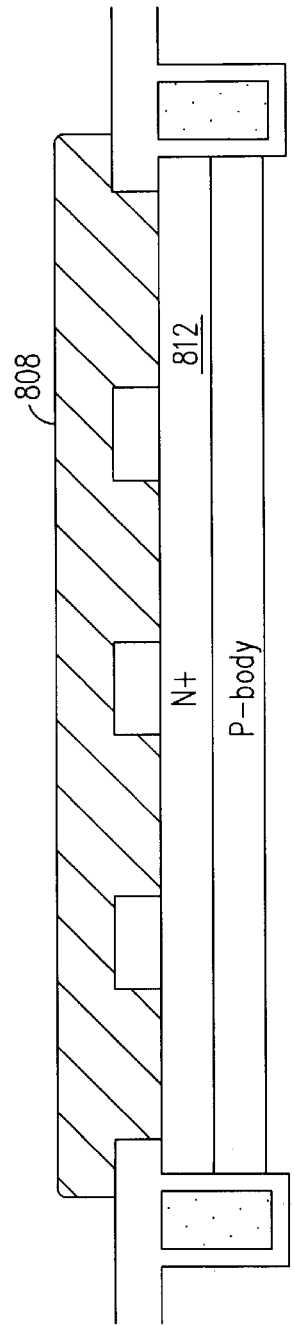

Active MOSFET cells 802, 803 and 804 are shown in plan view in FIG. 8B and at cross-sections CC', DD', EE', FF' and GG' in FIGS. 8E, 8F, 8G, 8H and 8I, respectively. MOSFET cells 802, 803 and 804 contain P-body regions 807 and N+ source regions 812. At the top surface of the silicon wide P+ contact regions 805 are formed periodically along the length of the cell. Between the wide P+ contact regions 805 are narrow P+ contact regions 806. The other areas at the surface of the cells are occupied by the N+ source regions 812 which include narrow sections 810 and wide sections 811. A metal contact layer 808 makes contact with and P+ regions 805 and 806 N+ source regions 812, as shown in FIGS. 8E and 8F. The P+ diffusion also extends to an end segment 813 which prevents N-type dopant from reaching the corners (e.g., corner 814) of the active MOSFET cells 802, 803 and 804 where it could cause leakage. The distance from the edge of the metal contact layer 808 to the edge of the trench (dimension "y" in FIGS. 8E and 8F) will typically range from 0.25 μm to 1 μm.

This arrangement maximizes the contact overlap with both the wide P+ regions 805 for connection for good contact with the P-body regions 807 and with the wide N+ sections 811 for good contact with the N+ source regions 812. In particular, this arrangement provides: (i) excellent contact with the P-body (via the P+ regions) across the width of the MOSFET cell (the Y direction); (ii) excellent contact with the N+ source region across the width of the MOSFET cell; (iii) good contact with the N+ source region along the length of the MOSFET cell (the X direction); (iv) contact via alternating regions of N+ and P+. It also provides good contact with the deep P+ diffusion in the diode cell 801 in both the X and Y directions.

As shown in FIGS. 8D, 8G, 8H and 8I, metal contact layers 808 and 809 have gaps where they do not make contact with the silicon. The gaps yield smaller contact openings that are more susceptible to photolithographic techniques. In alternative embodiments these gaps can be omitted.

Figure 8J:
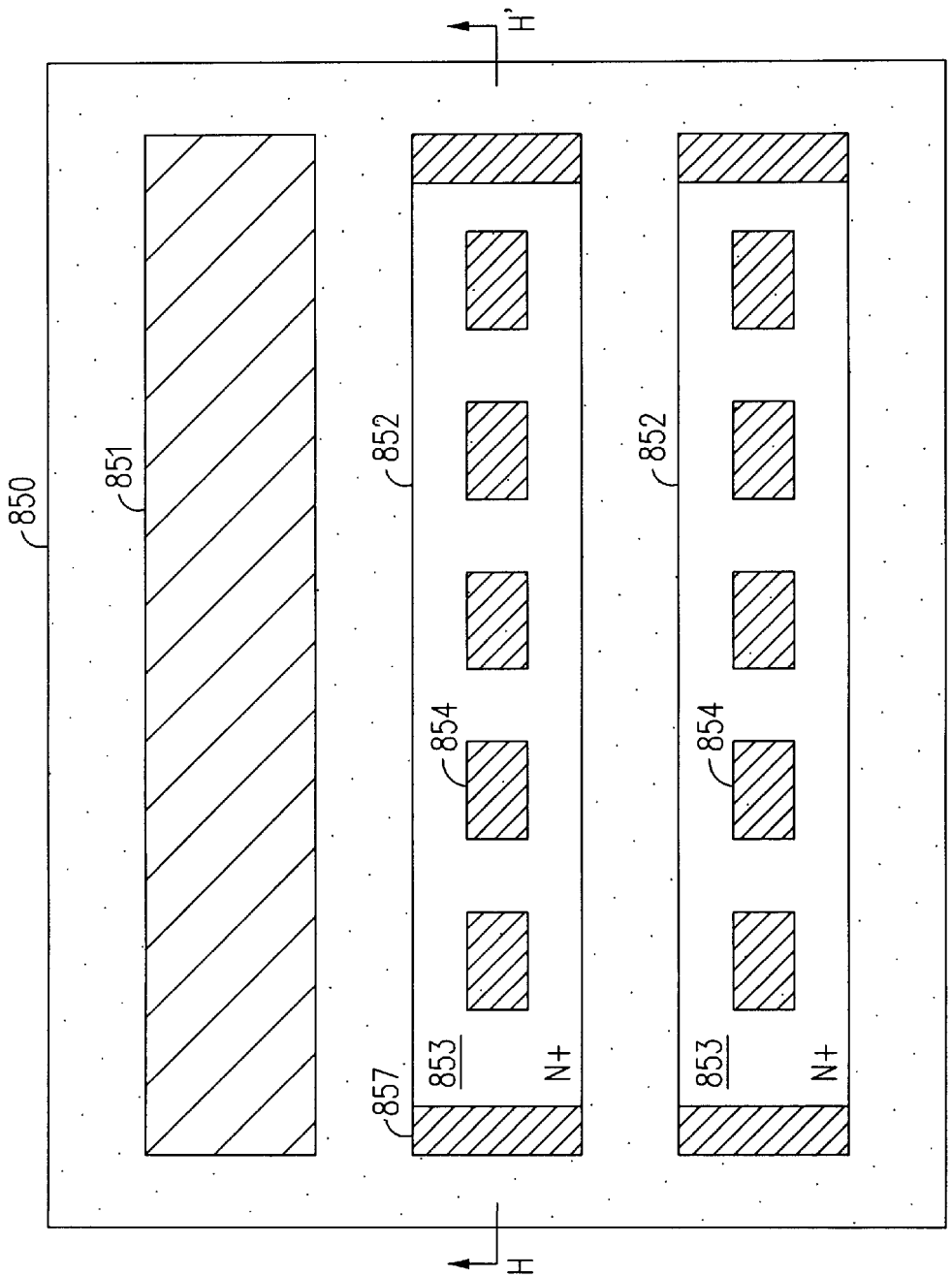
FIG. 8J illustrates a plan view of another form of striped-cell MOSFET containing a group of body contact islands.
Figure 8K:
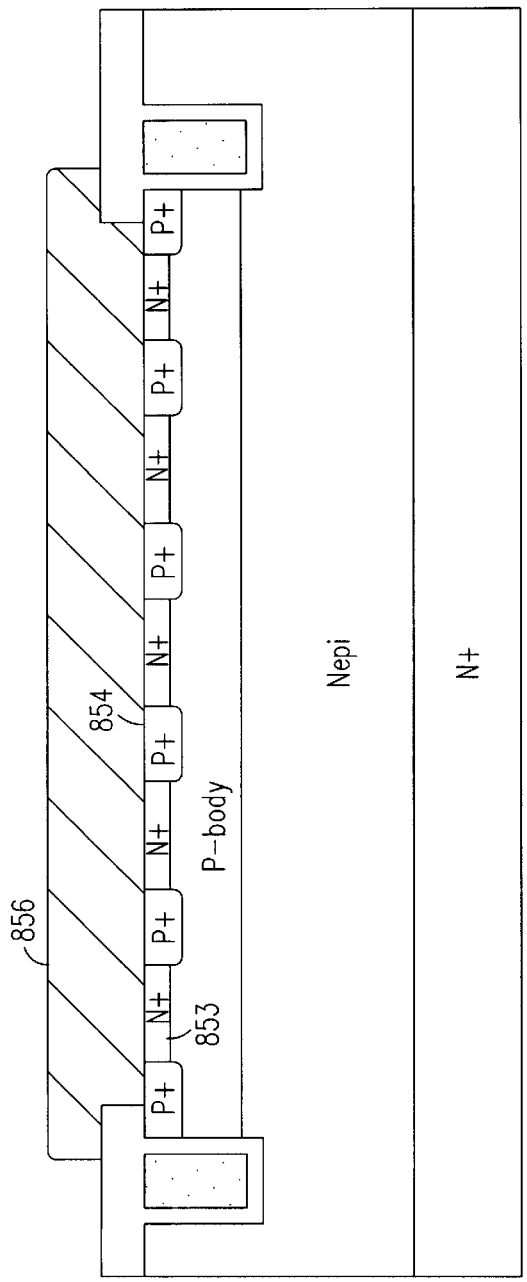
FIG. 8K illustrates a cross-sectional view of one embodiment of the MOSFET of FIG. 8J.
Figure 8L:
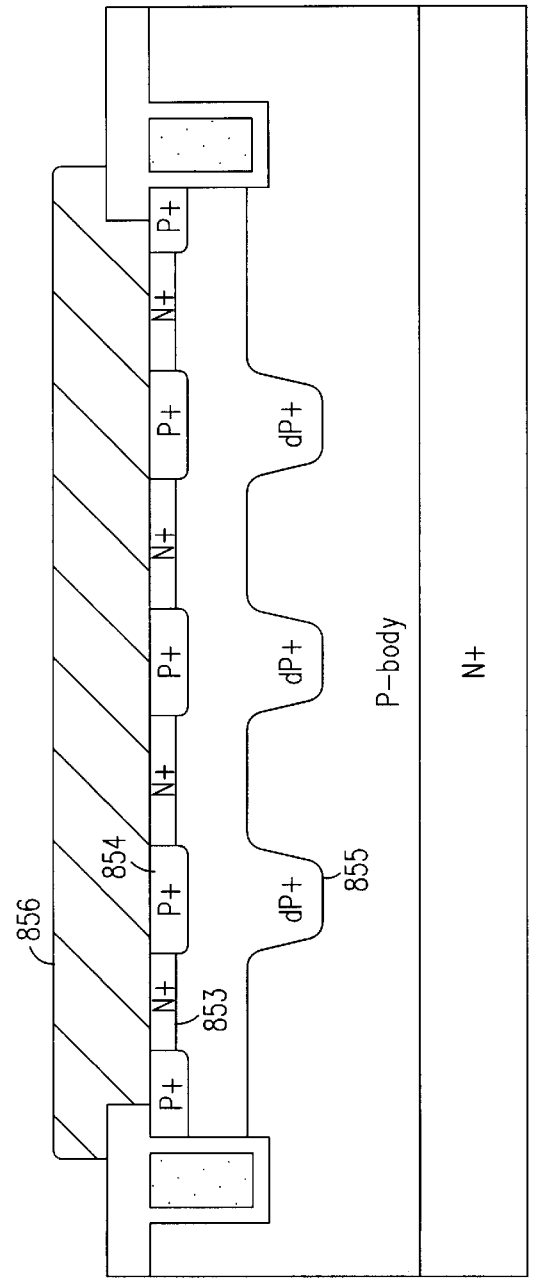
FIG. 8L illustrates a cross-sectional view of an alternative embodiment of the MOSFET of FIG. 8J in which deep P+ diffusions underlie the body contact regions.

Another form of striped cell geometry is shown in FIGS. 8J, 8K and 8L. FIG. 8J is a plan view of a MOSFET 850 which includes a diode cell 851 and active MOSFET cells 852. MOSFET cells 852 contain an N+ source region 853 which is punctuated by P+ body contact regions 854. P+ end regions 857 prevent N-type dopant from reaching the corners of the cells 852, where it could cause leakage. FIGS. 8K and 8L are views of alternative embodiments taken at cross-section HH'. In the embodiment of FIG. 8K P+ body contact regions 854 are left shallow and the diode cell 851 is relied upon for voltage clamping. In the embodiment of FIG. 8L deep P+ diffusions 855 are formed directly beneath P+ body contact regions 854, assuring that breakdown occurs in the bulk silicon away from the gate oxide.

Another use of the P+ diode cell is to clamp the drain voltage so as to protect the gate oxide layer from overstress due to excessive electric fields between the gate and the N+ substrate. This situation arises particularly in embodiments where the trench gate extends into the substrate and the gate oxide layer at the bottom of the trench is therefore exposed to the entire voltage difference between the gate and substrate. Silicon dioxide is capable of withstanding a voltage equal to about 8 MV/cm. Using a safety factor of 50%, the industry generally considers the maximum voltage that may be applied across a gate oxide layer to be $X_{OX} \cdot 4$ MV/cm, $X_{OX}$ being the thickness of the gate oxide in centimeters. Accordingly, the breakdown voltage of the diode that is formed by the protective P+ diffusion should be no greater than $X_{OX} \cdot 4$ MV/cm. For example, with an oxide layer having a thickness of 400 , the oxide layer will rupture at about 32 V, and for reliable operation the maximum voltage should be limited to 16 V. For thin oxides (below, e.g., about 150 A) the maximum field that is safe for an oxide increases slightly up to about 10 MV/cm, since conduction due to tunneling (a quantum mechanical phenomenon) does not create oxide damage to the same extent as avalanche breakdown.

Figure 9:
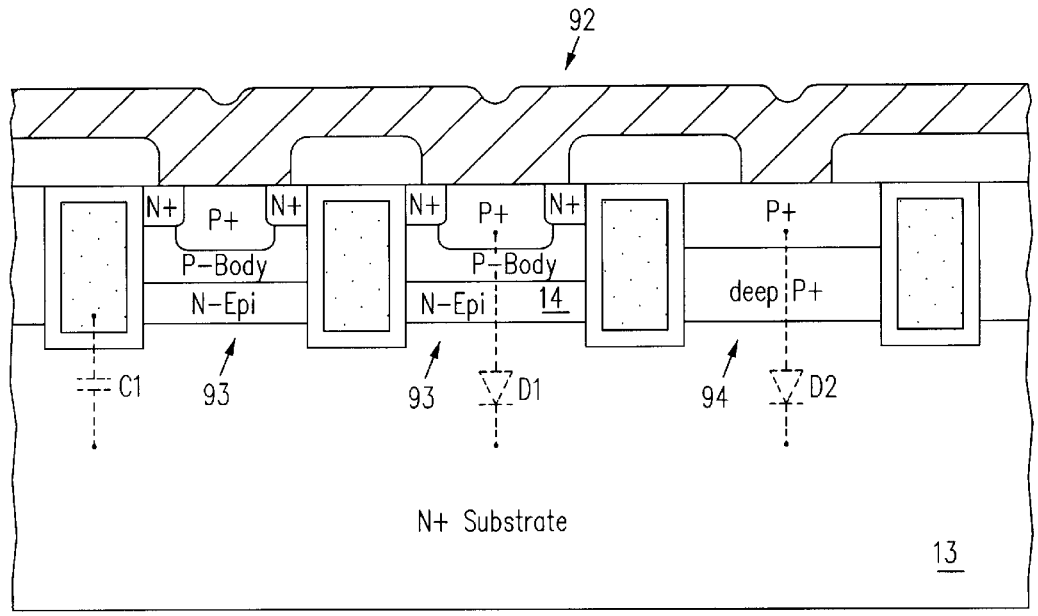
FIG. 9 illustrates another cross-sectional view of the second embodiment in accordance with this invention.
Figure 10:
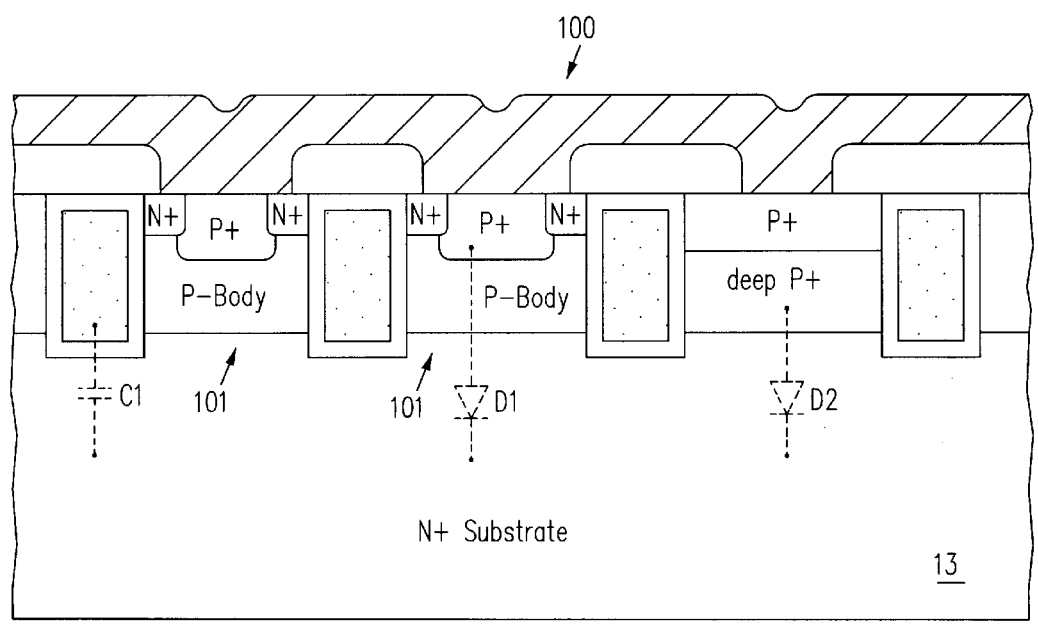
FIG. 10 illustrates a cross-sectional view of a third embodiment in accordance with this invention.
Figure 11:
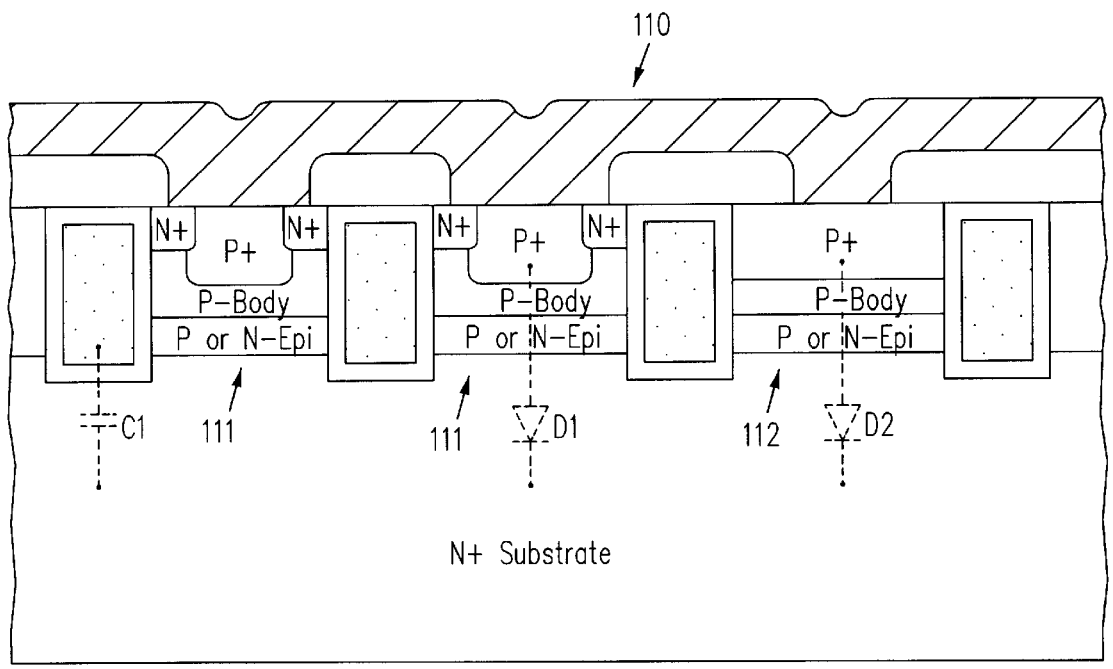
FIG. 11 illustrates a cross-sectional view of a fourth embodiment in accordance with this invention.

FIGS. 9–11 illustrate cross-sectional views of several alternative embodiments in accordance with the invention. FIG. 9 shows a MOSFET 92 in which the trenches extend into the N+ substrate 13. A thin layer of N-epitaxial layer remains in the MOSFET cells 93, while in diode cell 94 the protective P+ diffusion reaches the top surface of N+ substrate 13. In the MOSFET 100 shown in FIG. 10, the P-body regions in the MOSFET cells 101 extend to the top surface of the N+ substrate 13, and none of the N- doped region of epitaxial layer 14 remains. In the MOSFET 110 shown in FIG. 11, a thin section of the epitaxial layer 14, doped P- or N-, remains in each of the MOSFET cells 111 and the diode cell 112.

In FIGS. 9–11, diode D1 represents the PN junction within the MOSFET cells, diode D2 represents the PN junction in the protective diode cells, and a capacitor C1 represents the gate oxide layer abutted by the gate and the N+ substrate. In all three cases the relationship $BV_{D2} \leq 50\% \cdot BV_{C1}$ should hold, where $BV_{D2}$ is the breakdown voltage of diode D2 and $BV_{C1}$ is the breakdown voltage of capacitor C1. Also, the breakdown voltage of diode D2 is less than the breakdown voltage of diode D1 in each case.

Figure 12:
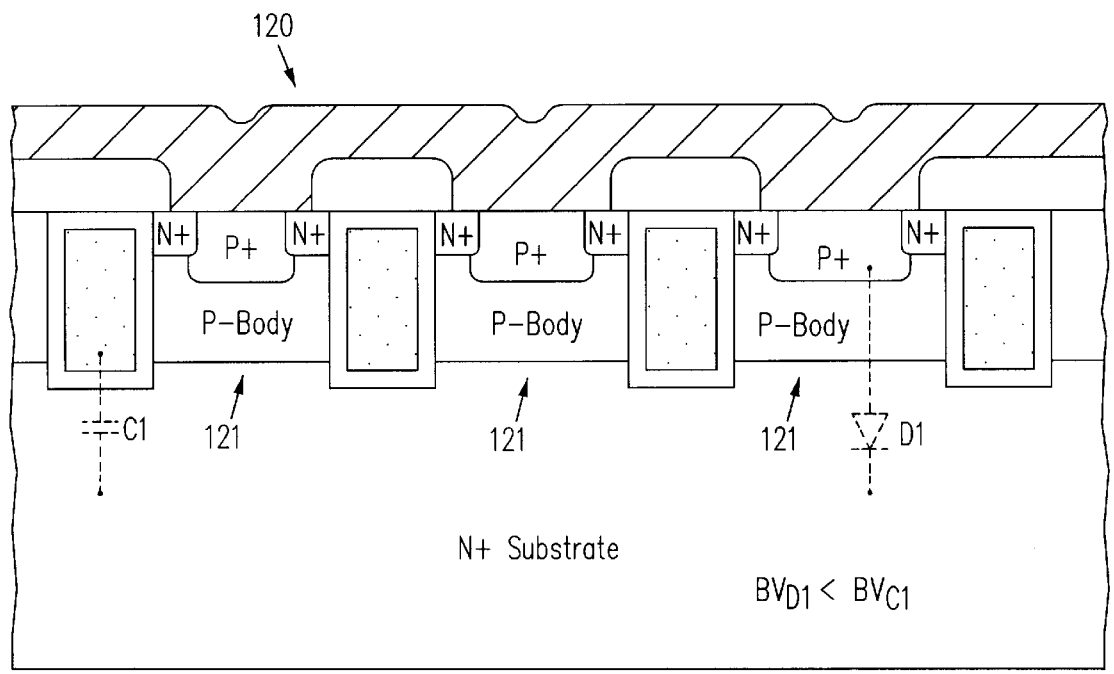
FIG. 12 illustrates a cross-sectional view of a fifth embodiment in accordance with this invention.

MOSFET 120, shown in FIG. 12, appears to be similar to the conventional MOSFET shown in FIG. 2A. Diode D1 represents the PIN diode formed at the center of each MOSFET cell by the combination of the shallow P+ contact region, the P-body and the N+ substrate. In MOSFET 120 the breakdown voltage of PIN diode D1 is set at less than 50% of the breakdown voltage of capacitors C1, wherein the breakdown voltage of the capacitors is calculated on the basis of 8 MV/cm for the thickness of the gate oxide layer expressed in centimeters. As a result, in MOSFET 120 breakdown will occur, if at all, in the central region of the individual cells and at a voltage which will not damage the gate oxide layers.

Figure 13A:
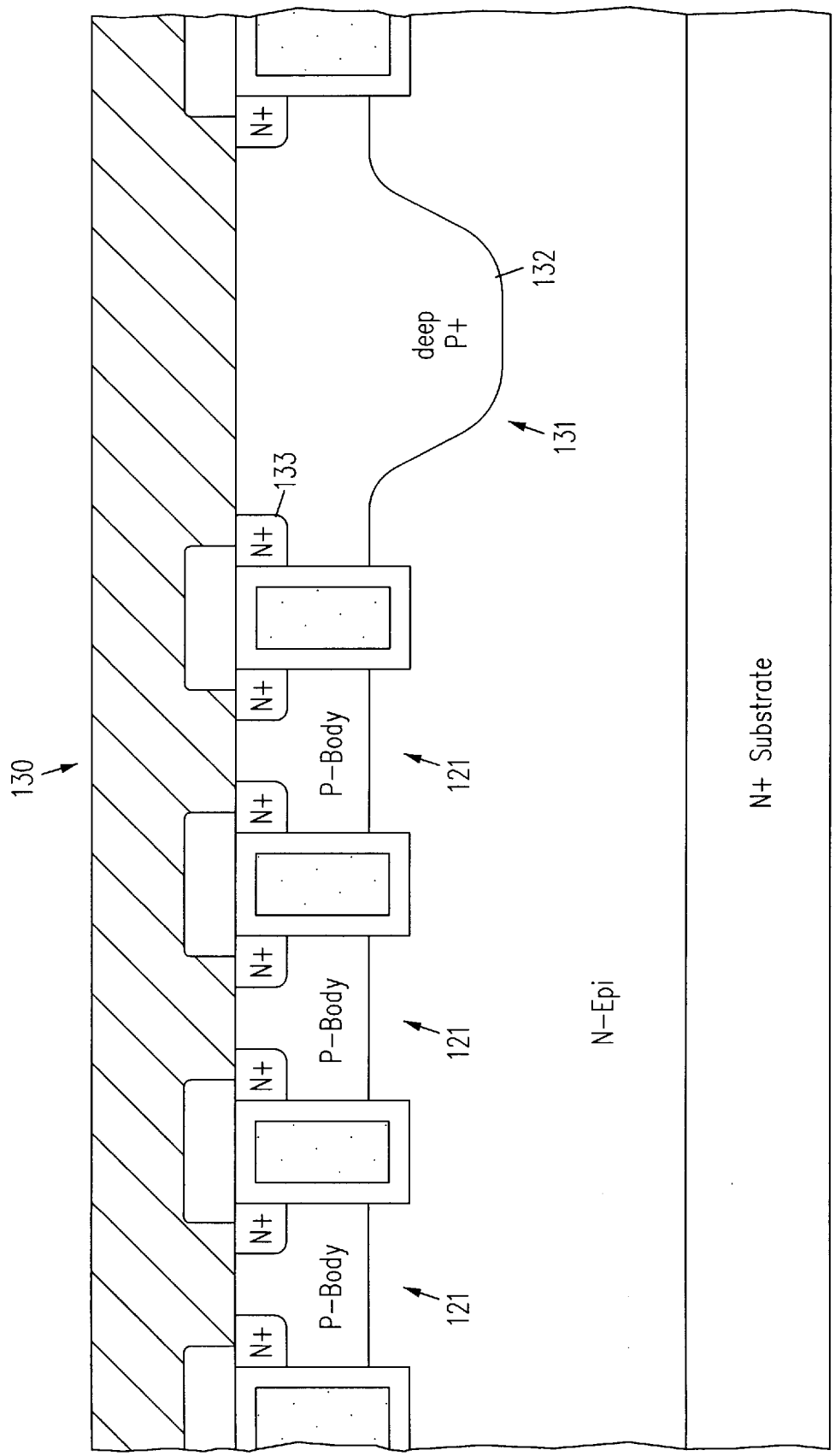

Another alternative embodiment is illustrated in FIGS. 13A and 13B, FIG. 13A being a cross-sectional view taken at section XIIIA—XIIIA shown in the top view of FIG. 13B. MOSFET 130 includes cells 121 as well as a wider cell 131 which includes a deep P+ region 132. Deep P+ region 132 provides a protective function for the gate oxide layers in cells 121 while acting as an active MOSFET cell itself, having an N+ source region 133. Thus, while cell 131 reduces the overall cell density of the MOSFET, the penalty in terms of on-resistance is less than it would be if cell 131 performed only a protective function and carried no current. As in MOSFET 120 of FIG. 12, cells 121 are typically smaller than they would be if a protective deep P+ region were included in each cell.

Although there are numerous processes for fabricating a MOSFET in accordance with this invention, FIGS. 14A–14E illustrate an exemplary process for fabricating MOSFET 30 shown in FIG. 3.

Figure 14A:
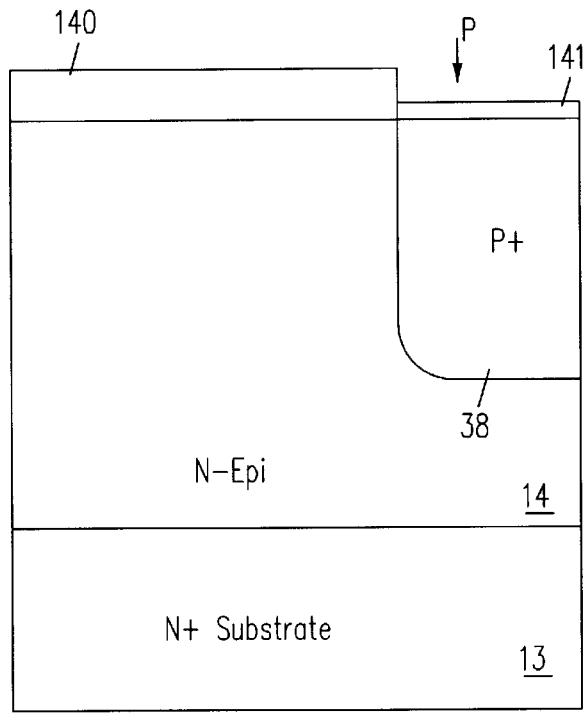
FIGS. 14A–14E illustrate the steps of a process of fabricating the MOSFET shown in FIG. 3.

Referring to FIG. 14A, the starting point is a conventional N+ substrate 13 on which an N-epitaxial layer 14 is grown using known processes.

A thick oxide layer 140 is grown, masked and etched, and a thin oxide layer 141 is grown on the top surface of the structure where deep P+ region 38 is to be formed. Deep P+ region 38 is then implanted through thin oxide layer 141 at a dose of $1 \times 10^{14}$ to $7 \times 10^{15}$ cm$^{-2}$ and an energy of 60–100 keV. The resulting structure is illustrated in FIG. 14A. Oxide layers 140 and 141 are then removed.

Alternatively, the deep P+ region 38 could be formed by predeposition using a gaseous or solid source such as BN which outgases during the furnace cycle, thereby doping the region to a sheet resistance of 40 to 300 Ů/. If a P-channel device is desired, the dopant source may be POCl$_3$, producing a highly doped N+ region.

Figure 14B:
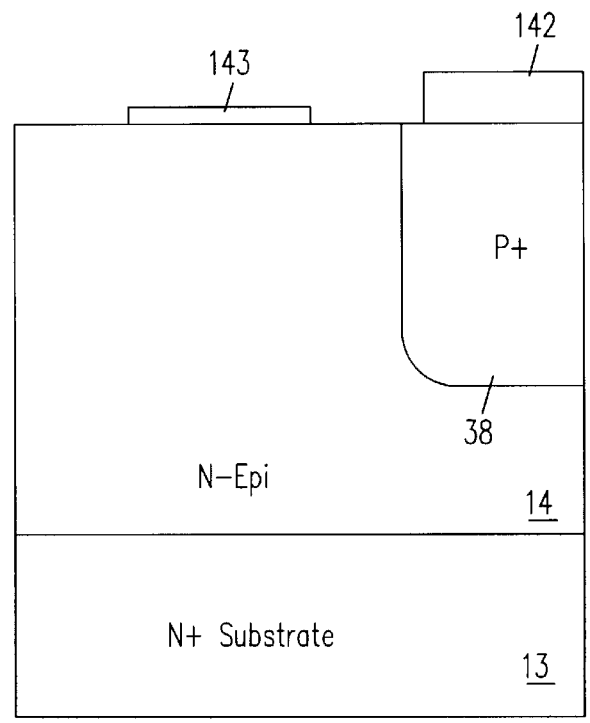

In one version of the process, a thick oxide layer 142 is grown and removed by photomasking except over deep P+ region 38, and a thin oxide layer 143 is grown. Thin oxide layer 143 is masked and removed from the portions of the structure where the trenches are to be formed, as shown in FIG. 14B. The trenches are then masked and etched using known techniques of reactive ion or plasma dry etching. Then the trench is oxidized to form gate oxide layer 31A, and polysilicon is deposited into the trench until it overflows the top of the trench. The polysilicon is then doped with phosphorus by POCl$_3$ predeposition or ion implantation at a dose of $5 \times 10^{13}$ to $5 \times 10^{15}$ cm$^{-2}$ and an energy of 60 keV, giving it a sheet resistance of 20–70 Ů/. For a P-channel device, the polysilicon is doped with boron using ion implantation to a sheet resistance of roughly 40–120 Ů/. The polysilicon is then etched back until it is planar with the surface of the trench except where a mask protects it, so that it can subsequently be contacted with metal.

Figure 14C:
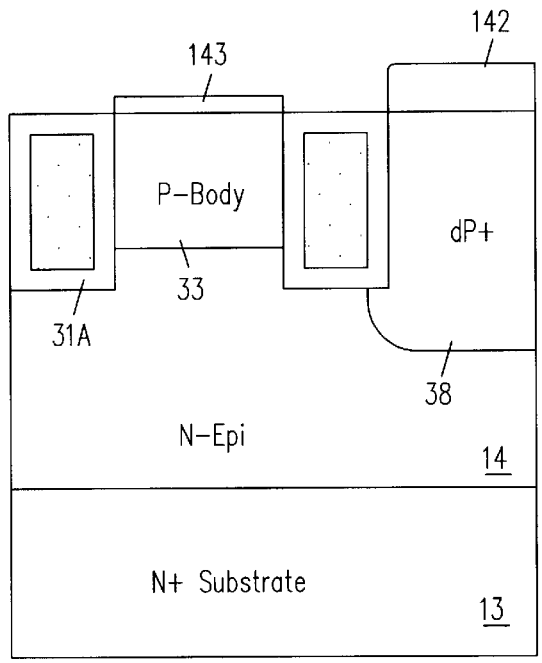

P-body 33 is then implanted through the thin oxide layer 143 (e.g., boron at a dose of $1 \times 10^{13}$ to $4 \times 10^{14}$ cm$^{-2}$ and an energy of 40–100 keV). A similar method is used in fabricating a P-channel device except that the dopant is phosphorus. The resulting structure is illustrated in FIG. 14C.

Figure 14D:
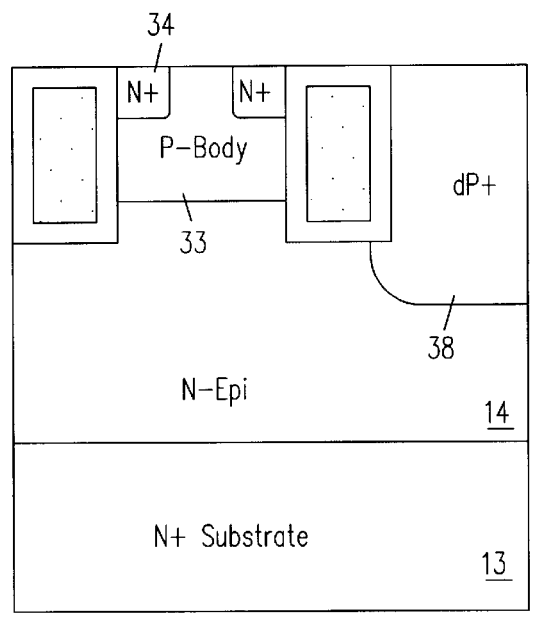

The N+ source region 34 is then introduced using a mask and an arsenic ion implantation (or a boron ion implantation for a P-channel device) at a dose of $5 \times 10^{14}$ to $1 \times 10^{16}$ cm$^{-2}$ at 20 to 100 keV. The resulting structure is shown in FIG. 14D.

Figure 14E:
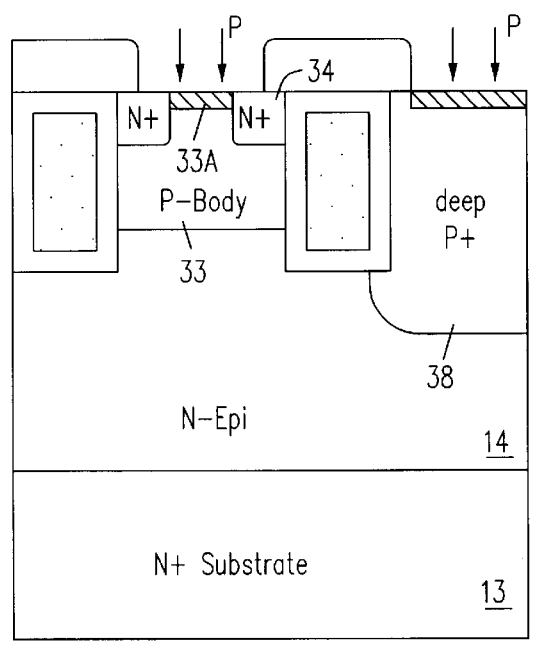

Following the formation of the N+ source region 38, a new mask is formed and the shallow P+ region 33A that is used to contact the P-body is introduced by ion implantation at a dose of $1 \times 10^{13}$ to $5 \times 10^{14}$ cm$^{-2}$ at 20–80 keV. Alternatively, as shown in FIG. 14E, shallow P+ region 33A can be formed by implanting P-type dopant through the same mask that is used in forming the contact holes for the N+ source region/P+ contact region and the deep P+ region. Although with this technique some of the P-type dopant is implanted into N+ source region 34, the level of P-type doping is not sufficient to significantly affect the concentration of N-type ions in the N+ source region.

A thin oxide layer is thermally grown. Borophosphosilicate glass (BPSG) is then deposited on the surface of the structure. The BPSG is momentarily heated to around 850 to 950 C. to flow smoothly and flatten the surface topology of the die. Contact holes are etched in the oxide and BPSG layers, and metal layer 36 is deposited, forming contacts with the source and body regions and the deep P+ region through the contact holes. This yields MOSFET 30 shown in FIG. 3.

The die is then passivated with SiN or BPSG, and pad mask windows are etched to facilitate bonding.

Various structures may be used to insure that the breakdown of the diode occurs away from the trench and the gate oxide layer and to regulate the breakdown voltage of the diode.

Figure 15B:
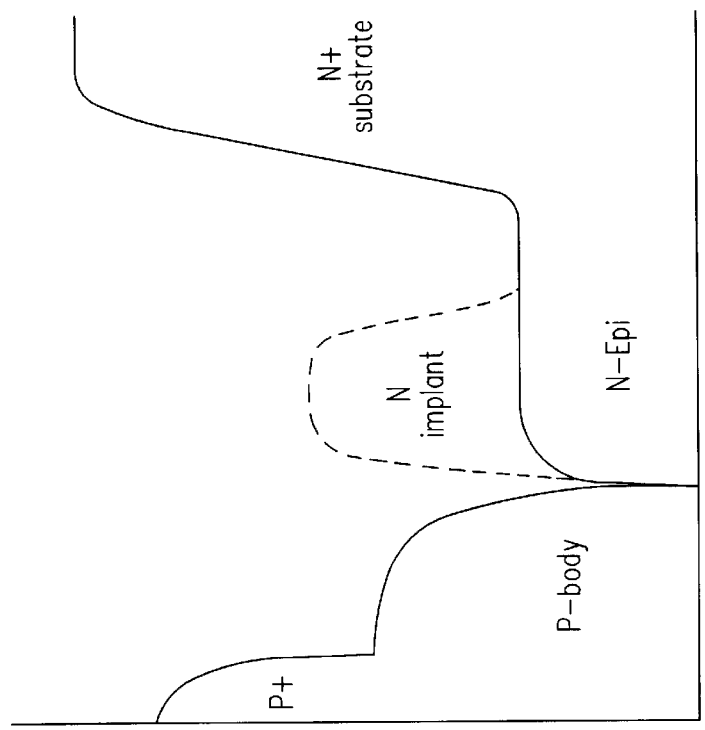
FIG. 15B illustrates a graph showing the dopant concentrations in the embodiment of FIG. 15A.
Figure 15A:
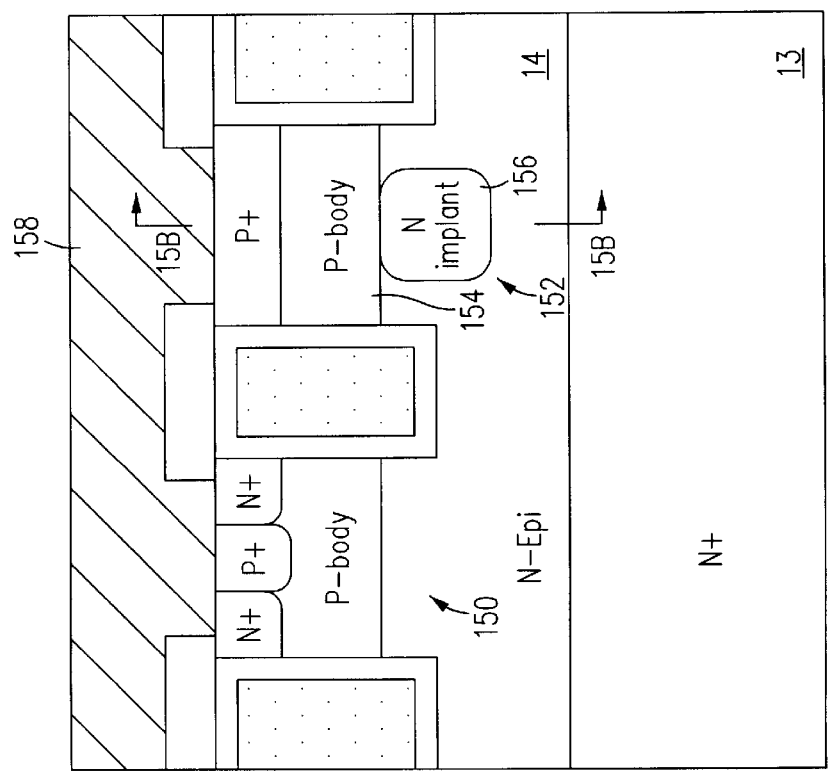
FIG. 15A illustrates a seventh embodiment wherein a breakdown voltage control region having a dopant concentration higher than that of the epi-layer is implanted in the diode cell.

In FIG. 15A MOSFET cell 150 contains no central P+ diffusion and thus is similar to MOSFET cell 35 in FIG. 3. Diode cell 152 contains a P-body diffusion 154, and an N-type breakdown voltage control region 156 is formed directly beneath the P-body diffusion at the center of diode cell 152. By raising the dopant concentration of the N-epi layer 14 in the region of breakdown voltage control region 156, the breakdown voltage of diode cell 152 is reduced locally at the center of the cell thereby insuring that this is where breakdown will occur. Breakdown voltage control region 156 can be formed as a part of the body diffusion or it could be implanted, for example, at a dose of $2 \times 10^{13}$ to $2 \times 10^{15}$ cm$^{-2}$ and at an energy of 200 keV to 3 MeV through the metal contact layer 158 (with 1.5 MeV being typical). Alternatively, breakdown voltage control region 156 can be formed as buried layer by creating an updiffusion from the interface between N+ substrate 13 and N-epi layer 14. For example, if N+ substrate is doped with arsenic, the updiffusion could be created with phosphorus. The updiffusion could extend all the way to the P-body diffusion 154 or it could stop short of P-body diffusion 154. The important consideration is that by increasing the dopant levels in the N-epi layer at the center of diode cell 152 the breakdown voltage of the diode is reduced and the breakdown is localized in the region of the increased dopant levels.

FIG. 15B is a graph showing the dopant concentration at the cross-section 15B—15B in FIG. 15A. The dopant of breakdown voltage control region 156 is shown by the dashed line. The peak dopant concentration in the breakdown voltage control region could be, for example, from 10% to 100% higher than the background level in N-epi layer 14.

Figure 16A:
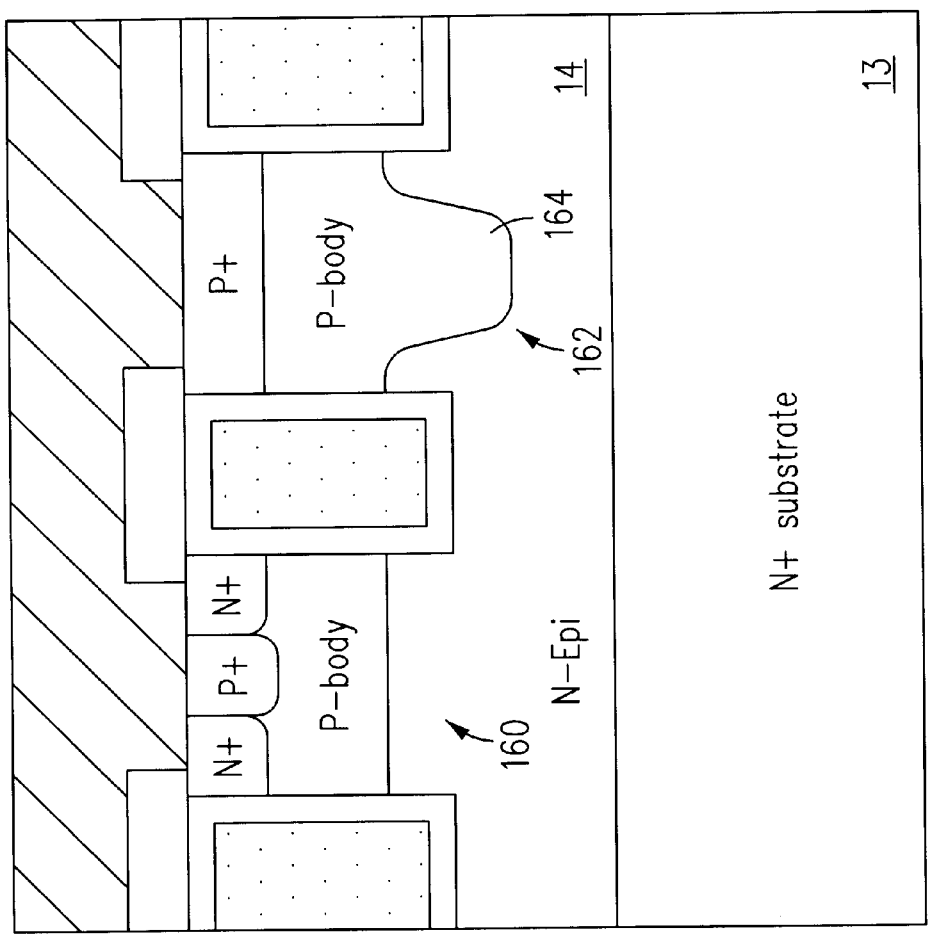
FIG. 16A illustrates a embodiment wherein the diode cell contains a deep diffusion which forms a curved junction with the background doping in the epi layer.
Figure 16D:
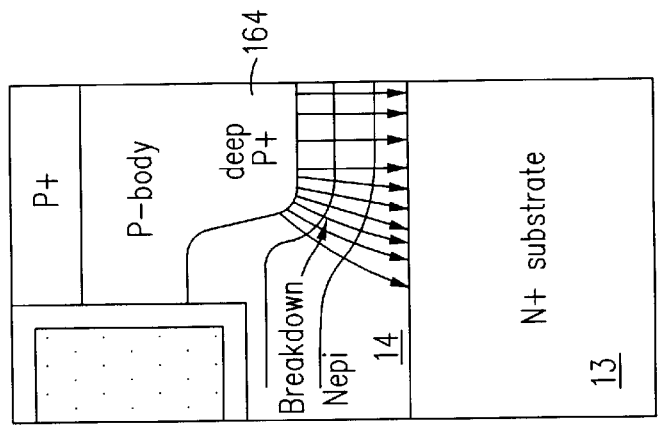
FIGS. 16B–16D illustrate how the curvature of the deep diffusion and the proximity of the deep diffusion to the substrate can be used to control the breakdown voltage of the diode cell.

FIG. 16A illustrates a conventional vertical trench MOSFET cell 160 along with a diode cell 162. Diode cell 162 contains a deep central P+ diffusion 164 which forms a PN junction with N-epi layer 14. FIG. 16B shows how the breakdown occurs if the N-epi layer 14 is doped fairly heavily, the PN junction is well defined (deep P+ diffusion was exposed to a minimal amount of thermal processing) and includes a curved segment 166 which has a rather small radius of curvature, and the deepest point of the deep P+ diffusion 164 is well separated from the N+ substrate 13. As shown in FIG. 16B, when a reverse voltage is imposed on the PN junction between P+ diffusion 164 and N-epitaxial layer 14 breakdown occurs primarily in the curved segment 166 of the PN junction, and a current flows radially outward from the curved segment 166. The magnitude of the breakdown voltage is strongly dependent on the radius of curvature of the curved segment 166. The smaller the radius of curvature, the lower the breakdown voltage. (See S. M. Sze, *Physics of Semiconductor Devices*, Second Edition, John Wiley & Sons (1981), p. 108, FIG. 35) In this situation the deep P+ diffusion 164 does not necessarily have to extend below the trench in order to provide satisfactory protection for the gate oxide layer.

Figure 16C:
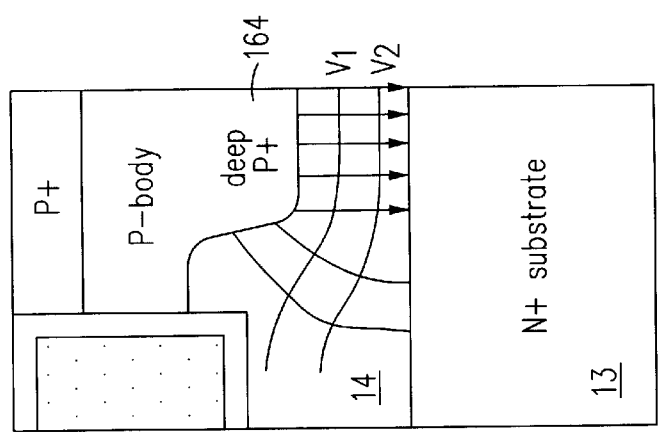
Figure 16B:
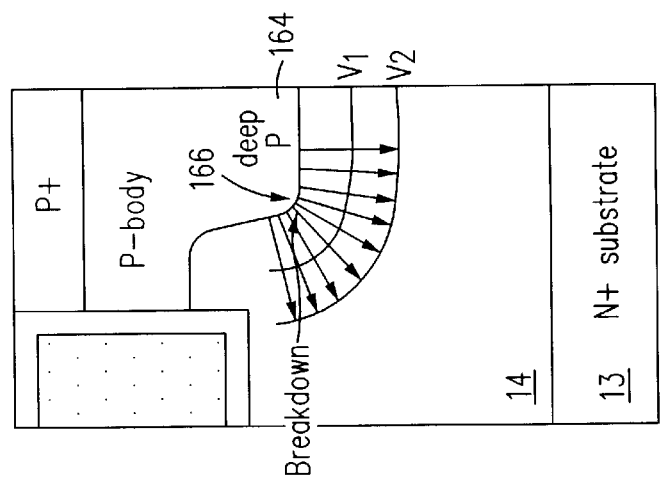

In FIG. 16C the N-epi layer is doped less heavily, the deep P+ diffusion 164 extends much closer to the N+ substrate 13, and the PN junction between the P-body diffusion is less defined. Here a PIN diode is formed with the N-epi layer 14 acting as an "intrinsic layer" sandwiched between the deep P+ diffusion 164 and the N+ substrate 13. As shown in FIG. 16C breakdown occurs predominately in a vertical direction. The magnitude of the breakdown voltage depends primarily on the doping concentration of the N-epi layer 14 and the width of the N-epi layer 14 between deep P+ diffusion 164 and N+ substrate 13.

FIG. 16D shows an embodiment in which both of the effects shown in FIGS. 16B and 16C are present. That is, breakdown occurs both from the effects of the radius of curvature of the PN junction between deep P+ diffusion 164 and N-epi layer 14 and the PIN diode formed by deep P+ diffusion 164, N-epi layer 14 and N+ substrate 13.

As this discussion indicates, the breakdown voltage can be controlled by varying the radius of curvature of the PN junction between deep P+ diffusion 164 and N-epi layer 14. FIG. 17A shows an embodiment where the P+ diffusion 174 in diode cell 170 is kept well above the bottom of the trench and yet the breakdown voltage in diode cell 170 is set at an acceptable level solely by controlling the radius of curvature of the PN junction between P+ diffusion 174 and N-epi layer 14.

Figure 17B:
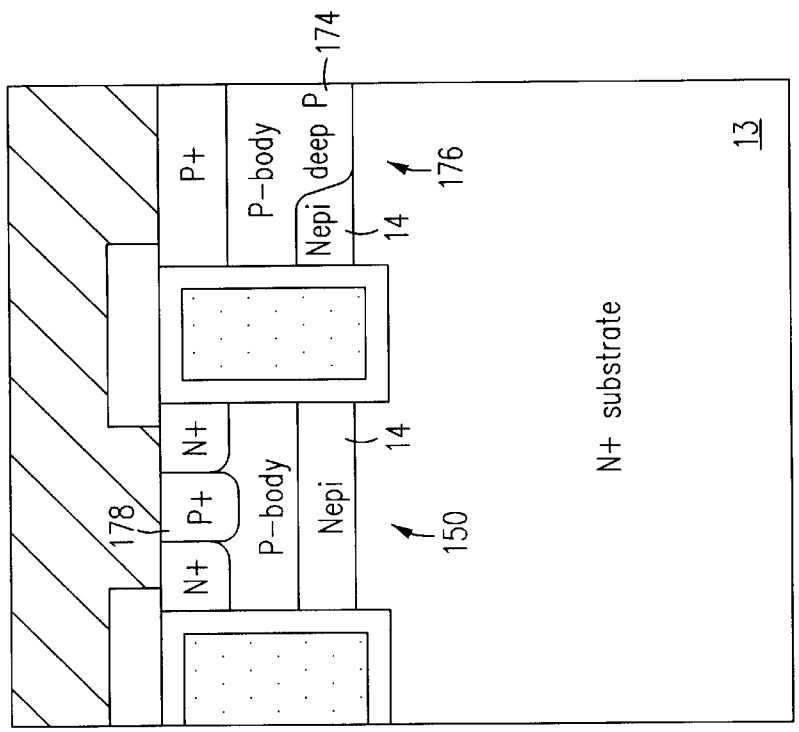
FIG. 17B illustrates an embodiment similar to that shown in FIG. 17A except that the gate trench extends into the substrate.
Figure 17A:
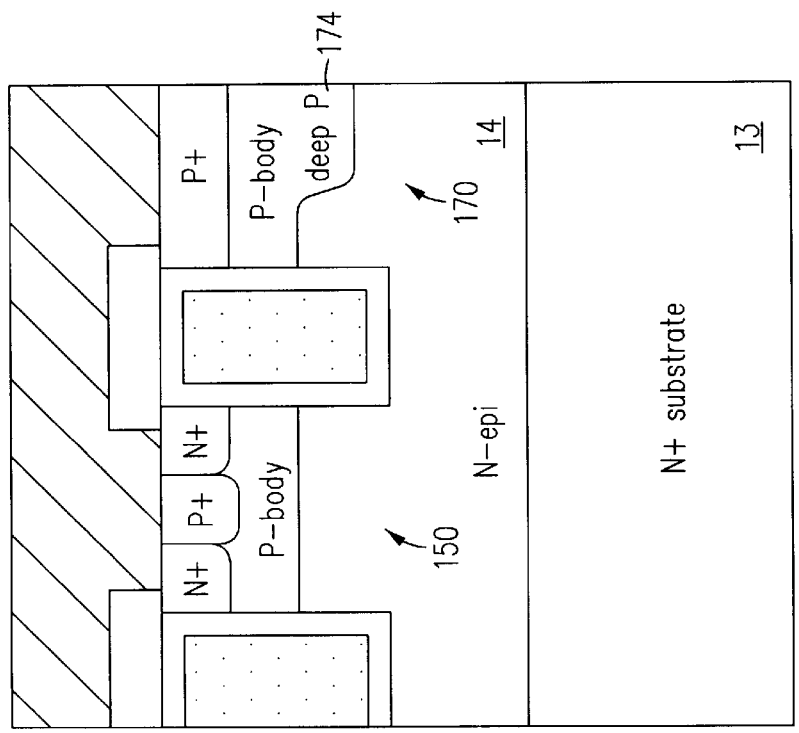
FIG. 17A illustrates an embodiment wherein the diffusion in the diode cell is maintained at a level above the bottom of the gate trench of the MOSFET.
Figure 17C:
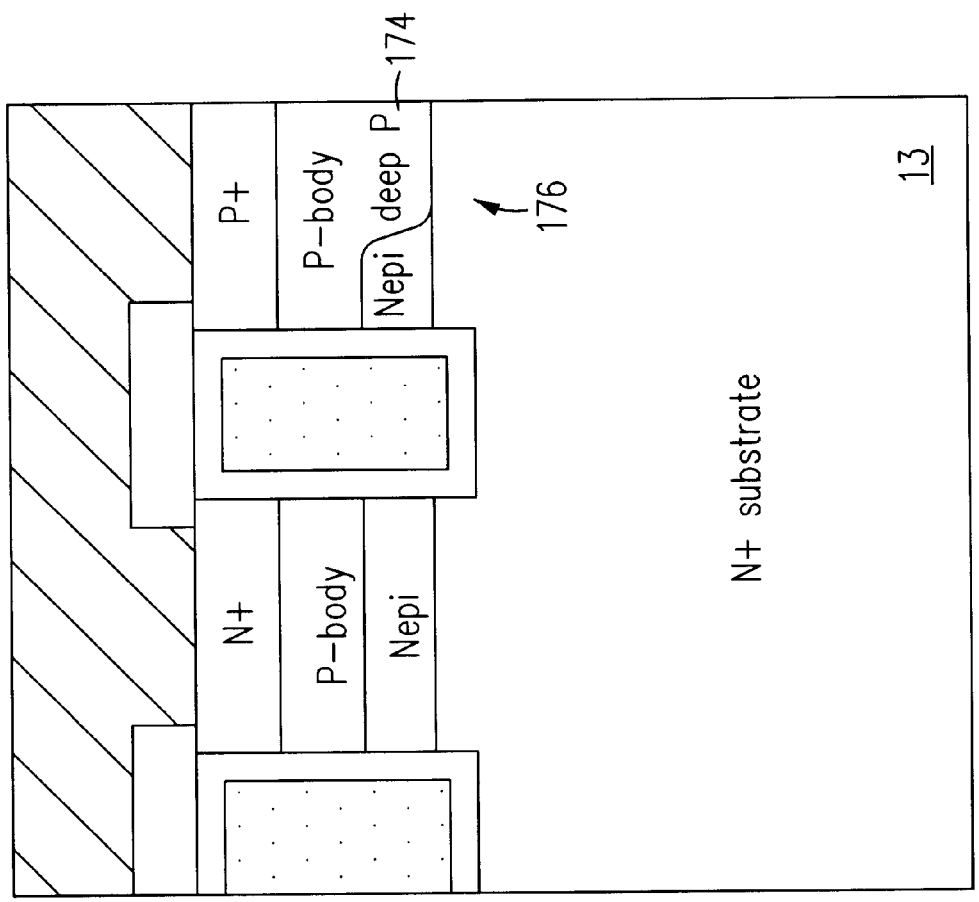
FIG. 17C illustrates an embodiment similar to that shown in FIG. 17B except that the body region in the MOSFET cell does not reach the surface of the epi layer.

The embodiment of FIG. 17B is similar but here the N-epi layer 14 is so thin that the trench extends into N-epi layer 14. Diode cell 176 contains a small slice of N-epi layer 14. The magnitude of the breakdown voltage of diode cell 176 is set by the PN junction between deep P+ region 174 and N+ substrate 13. As described above, this magnitude should be set at a voltage which is less than the thickness of the gate oxide layer (cm) multiplied by 4 MV/cm. The embodiment of FIG. 17C is similar, but the process of driving in the deep P+ diffusion 174 has resulted in the elimination of the P+ body contact region 178 in MOSFET cell 150. Thus the P-body region must be fully depleted of charge carriers and must be contacted, if at all, in another location of the power MOSFET.

Figure 18A:
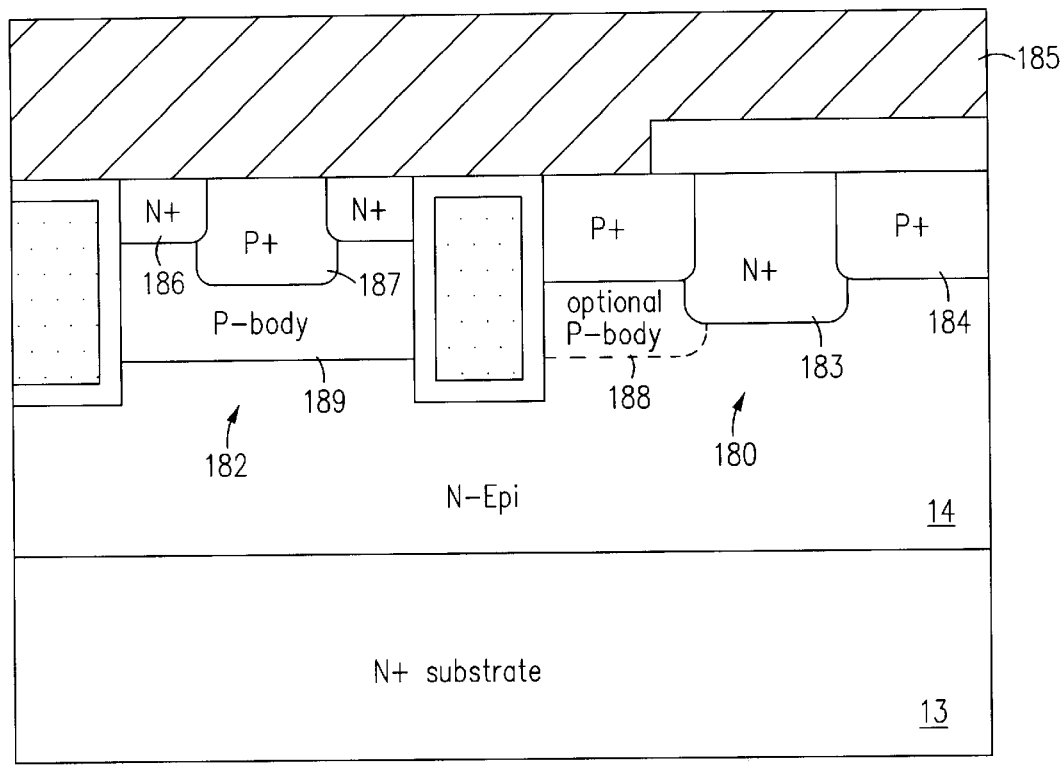
FIG. 18A illustrates an embodiment wherein the diode cell contains a zener diode near the surface of the epi layer.

Yet another embodiment is shown in FIG. 18A. Diode cell 180 contains an N+ diffusion 183 and a P+ diffusion 184 which are formed at the same times as the N+ source 186 and P+ body contact region 187 in MOSFET cell 182. Metal contact layer 185 contacts only the P+ diffusion 184 in diode cell 180. Since N+ diffusion 183 is essentially at the drain potential, the junction between N+ diffusion 183 and P+ diffusion 184 creates a diode in parallel with the channel of MOSFET cell 182. The characteristics of the junction between N+ region 183 and P+ region 184 set the breakdown of the diode cell 180. Alternatively, as shown by the dashed line, a portion 188 of the P-body diffusion can be introduced into the diode cell 180 to help shape the electric field. In another alternative (not shown) the P+ region 184 could be held back from the N+ region 183 so that P-body portion 188 is sandwiched by the N+ region 183 and P+ region 184 to form a PIN diode in diode cell 180.

Figure 18B:
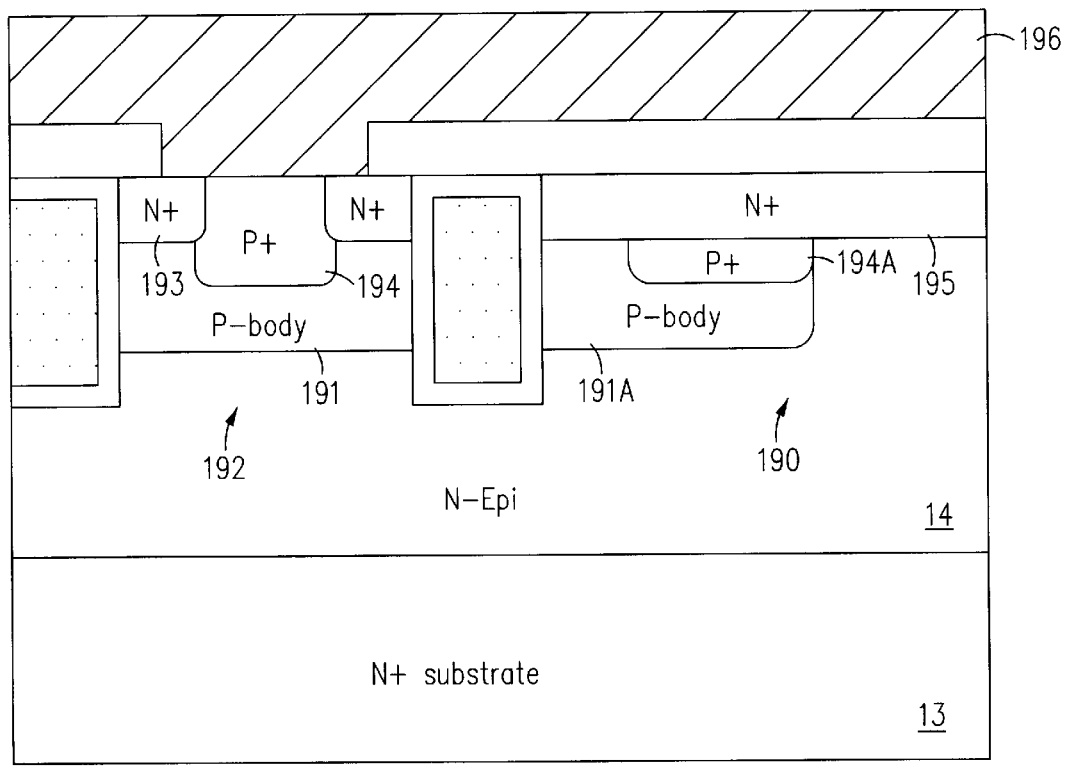
FIG. 18B illustrates an embodiment wherein the diode cell contains a buried zener diode.
Figure 18C:
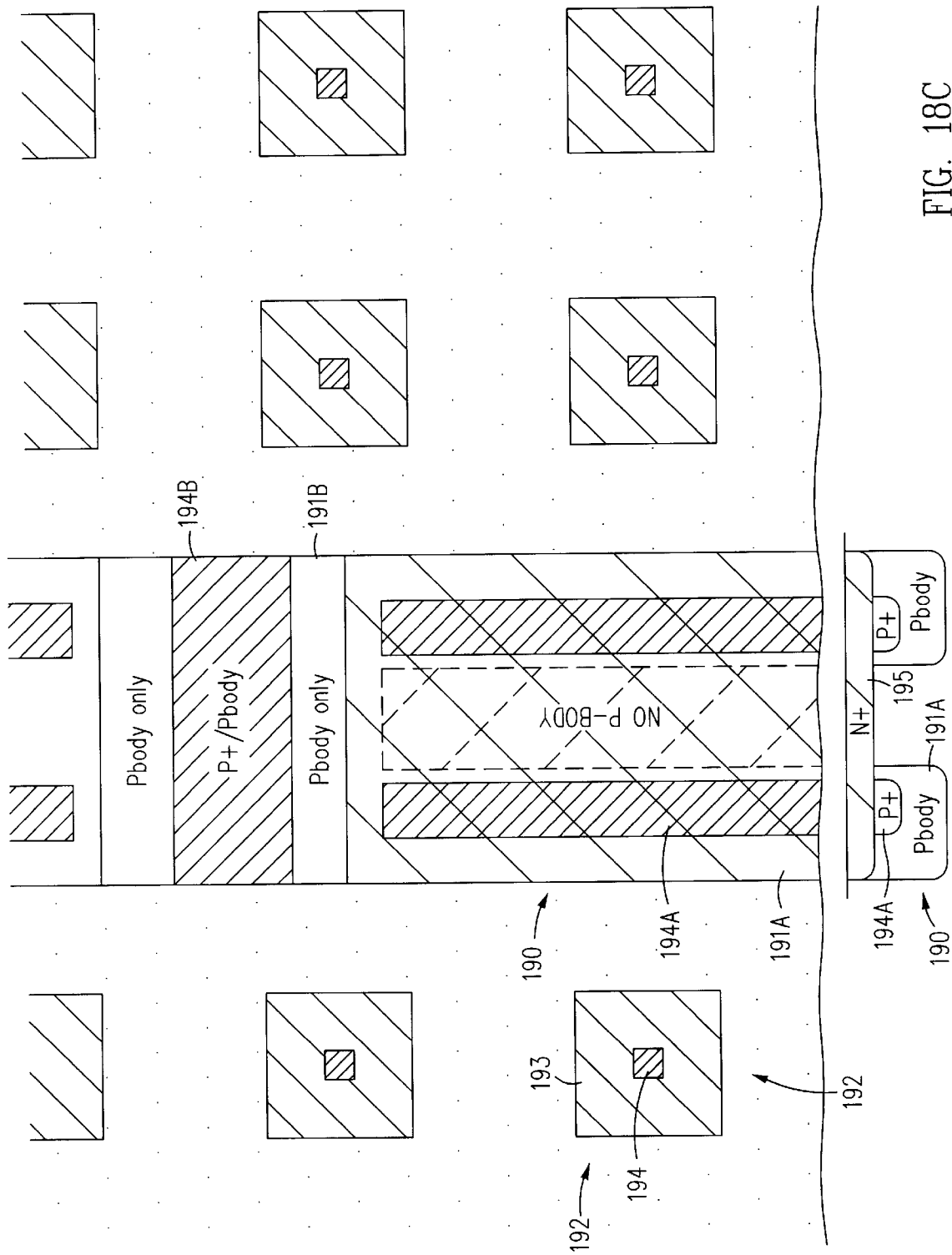
FIG. 18C illustrates a plan view of the embodiment of FIG. 18B, showing how the P+ region in the diode cell is connected to the P-body region in the MOSFET at a location away from the cross-section shown in FIG. 18B.

In the embodiment of FIG. 18B, the dopant which forms the N+ source region 193 in MOSFET cell 192 is allowed to extend across the top surface of the epi layer 14 in diode cell 190, but the N+ source region 193 in MOSFET cell 192 is not electrically connected to the N+ region 195 in diode cell 190. The P-body region 191A and P+ body contact region 194A lie beneath the N+ region 195 in diode cell 190. Metal contact layer 196 does not make contact with diode cell 190. The plan view of FIG. 18C shows how the P-body region 191A and P+ region 194A are connected to a P-body region 191B and a P+ region 194B at a location in the third dimension away from the section shown in FIG. 18B. P+ region 194B extends upward to the surface and makes contact with metal layer 196 (not shown), thereby forming an electrical connection with P+ region 194 and P-body region 191 in MOSFET cell 192. Thus, in the embodiment of FIGS. 18B and 18C N+ region 195 within diode cell 190 is essentially at the drain potential, and breakdown occurs between N+ region 195 and P+ region 194, away from the sidewall of the trench.

In the embodiments of FIGS. 18A–18C, impurity regions formed in the MOSFET cells (182 and 192, respectively) are used to form the regions which make up the diodes in diode cells (180 and 190, respectively). Thus additional implanting steps are not required. However, in some embodiments it will be necessary to employ separate implanting steps to form the regions of the diode cells. In FIG. 18A, a zener diode is formed between N+ region 183 and P+ region 184 at the surface of the N-epi layer 14. In FIG. 18B, a buried zener diode is formed in the diode cell 190. This may be advantageous because buried zener diodes tend to have more stable breakdown voltages than surface zener diodes. In both embodiments breakdown occurs away from the sidewall of the trench.

The embodiments described above are illustrative only and not limiting. Numerous alternative embodiments in accordance with the broad principles of this invention will be apparent to those skilled in the art.

I claim:

1. A trench-gated vertical power MOSFET comprising:
    a substrate of a first conductivity type
    an epitaxial layer formed on an surface of said substrate, said epitaxial layer having a background dopant level of said first conductivity type, said substrate and a portion of said epitaxial layer doped to said first conductivity type forming a drain region of said MOSFET;
    a gate positioned in a trench formed in a surface of said epitaxial layer, said trench defining a plurality of MOSFET cells and at least one diode cell, each of said MOSFET cells comprising:
    a source region of said first conductivity type and a body region of a second conductivity type adjoining said source region, said body region comprising a channel region adjacent a side of said trench, said channel region being for conducting a current between said source and drain regions when said power MOSFET is turned on;
    said at least one diode cell comprising:
        a protective diffusion of said second conductivity type, said protective diffusion forming a PN junction with said drain region so as to form a diode, said diode being connected in parallel with said channel region in each of said MOSFET cells, said diode cell containing no channel region; and
        a breakdown voltage control region formed in said portion of said epitaxial layer doped to said first conductivity, said breakdown voltage control region having a dopant concentration greater than said background dopant level.

2. The MOSFET of claim 1 wherein said breakdown voltage control region abuts said PN junction.

3. The MOSFET of claim 1 wherein the peak dopant concentration in said breakdown voltage control region is from 10% to 100% greater than said background level.

4. The MOSFET of claim 1 wherein said breakdown voltage control region is formed by implanting ions of said first conductivity type through a surface of said epitaxial layer.

5. The MOSFET of claim 1 wherein said breakdown voltage control region is formed by updiffusing a ions of said first conductivity type from an interface of said epitaxial layer and said substrate.

6. The MOSFET of claim 1 wherein said protective diffusion is shorted to the source region of each of said MOSFET cells.

7. The MOSFET of claim 1 comprising a plurality of said diode cells, said diode cells being positioned at regular intervals in a lattice formed by said gate.

8. The MOSFET of claim 7 wherein there are a predetermined number of said MOSFET cells for every diode cell.

9. A trench-gated vertical power MOSFET comprising:
    a substrate of a first conductivity type
    an epitaxial layer formed on an surface of said substrate, said epitaxial layer having a background dopant level of said first conductivity type, said substrate and a portion of said epitaxial layer doped to said first conductivity type forming a drain region of said MOSFET;
    a gate positioned in a trench formed in a surface of said epitaxial layer, said trench defining a plurality of MOSFET cells and at least one diode cell, each of said MOSFET cells comprising:
        a source region of said first conductivity type and a body region of a second conductivity type adjoining said source region, said body region comprising a channel region adjacent a side of said trench, said channel region being for conducting a current between said source and drain regions when said power MOSFET is turned on;
    said at least one diode cell comprising a first region of said first conductivity type and a second region of said second conductivity type, said second region being laterally disposed from said first region and being located between said first region and a sidewall of said trench, said first and second regions being comprised in a zener diode located near a surface of said epitaxial layer, said zener diode being connected in parallel with said channel.

10. The MOSFET of claim 9 wherein said first region abuts said second region.

11. The MOSFET of claim 9 wherein said diode cell further comprises a third region of said second conductivity for shaping an electric field within said diode cell.

12. A trench-gated vertical power MOSFET comprising:
    a substrate of a first conductivity type
    an epitaxial layer formed on an surface of said substrate, said epitaxial layer having a background dopant level of said first conductivity type, said substrate and a portion of said epitaxial layer doped to said first conductivity type forming a drain region of said MOSFET;
    a gate positioned in a trench formed in a surface of said epitaxial layer, said trench defining a plurality of MOS- FET cells and at least one diode cell, each of said MOSFET cells comprising:
  a source region of said first conductivity type and a body region of a second conductivity type adjoining said source region, said body region comprising a channel region adjacent a side of said trench, said channel region being for conducting a current between said source and drain regions when said power MOSFET is turned on;

said at least one diode cell comprising a first region of said first conductivity type, a second region of said second conductivity type, and a third region of said second conductivity type, said first region adjoining a top surface of said epitaxial layer, said second region being located below said first region and being separated from a sidewall of said trench, said third region adjoining said second region, said second region being doped to a dopant concentration greater than a dopant concentration of said third region, third region being electrically connected to said body region.

13. The MOSFET of claim 12 wherein said first region abuts said second region.

14. The MOSFET of claim 9 wherein said third region is doped to substantially the same dopant concentration as said body region.

* * * * *

UNITED STATES PATENT AND TRADEMARK OFFICE
CERTIFICATE OF CORRECTION

PATENT NO. : 5,998,837                                                                    Page 1 of 1
DATED : December 7, 1999
INVENTOR(S) : Richard K. Williams It is certified that error appears in the above-identified patent and that said Letters Patent is hereby corrected as shown below:

<u>Column 10,</u>
Line 32, delete "alternatively" and insert -- Alternatively --
Lines 35, 50 and 52, delete "U'/" and insert -- $\Omega/\square$ --.

Signed and Sealed this

Twenty-first Day of May, 2002

*Attest:*

*Attesting Officer*

JAMES E. ROGAN
*Director of the United States Patent and Trademark Office*